United States Patent
Ogata et al.

(10) Patent No.: US 7,061,017 B2
(45) Date of Patent: Jun. 13, 2006

(54) LASER ANNEAL METHOD OF A SEMICONDUCTOR LAYER

(75) Inventors: Hidenori Ogata, Gifu (JP); Ken Wakita, Gifu (JP); Kiyoshi Yoneda, Gifu (JP); Yoshihiro Morimoto, Inazawa (JP); Tsutomu Yamada, Ogaki (JP); Kazuhiro Imao, Gifu (JP); Takashi Kuwahara, Ogaki (JP)

(73) Assignee: Sanyo Electric Co., Ltd., Osaka (JP)

( * ) Notice: Subject to any disclaimer, the term of this patent is extended or adjusted under 35 U.S.C. 154(b) by 58 days.

(21) Appl. No.: 10/714,829

(22) Filed: Nov. 14, 2003

(65) Prior Publication Data
US 2004/0106246 A1 Jun. 3, 2004

Related U.S. Application Data

(60) Continuation of application No. 09/291,538, filed on Apr. 14, 1999, now abandoned, which is a division of application No. 08/911,505, filed on Aug. 14, 1997, now Pat. No. 6,274,414.

(30) Foreign Application Priority Data

Aug. 19, 1996 (JP) ............................................. 8-217424

(51) Int. Cl.
*H01L 29/76* (2006.01)

(52) U.S. Cl. .......................... 257/66; 438/308; 438/486; 438/795

(58) Field of Classification Search .................... 257/66, 257/70, 75, 59, 72; 438/308, 486, 795, 166
See application file for complete search history.

(56) References Cited

U.S. PATENT DOCUMENTS 4,234,358 A  11/1980  Celler et al.

(Continued)

FOREIGN PATENT DOCUMENTS

JP  SHO 64-76715  3/1989

(Continued)

OTHER PUBLICATIONS

M. Kamiya et al., "Eximer Laser Annealing SLA3600," pp. 24–25 with its English translations and Document 1 (Electronic Display Forum '96 program cover sheet, Apr. 17–19, 1996) and Document 2 (List of presentations at Forum '96, including Eximer Laser Annealing System SLA3600, Apr. 19, No. 18) showing the laid open date of Apr. 17–Apr. 19, 1996.

(Continued)

*Primary Examiner*—David Nelms
*Assistant Examiner*—Quoc Hoang
(74) *Attorney, Agent, or Firm*—Hogan & Hartson, LLP

(57) ABSTRACT

For obtaining p-Si by irradiating a laser beam to an a-Si layer to polycrystallize, an energy level in a region to be irradiated by the laser beam is set such that a level at the rear area of the region along a scan direction of the laser beam is lower than that at the front area or the center area of the region. The energy level at the front area or the center area of the region is set such that it is substantially equal to or more than the upper limit energy level which maximizes a grain size of the p-Si obtained. Since an energy profile is set as described above, when the laser beam is scanned on the a-Si layer, an irradiated energy of the laser on the region is gradually lowered from the upper limit as the laser beam passes through, which allows the semiconductor layer to be annealed within an optimal energy level during the latter half of the annealing process.

5 Claims, 25 Drawing Sheets

(8 of 25 Drawing Sheet(s) Filed in Color)

U.S. PATENT DOCUMENTS

| | | | |
|---|---|---|---|
| 4,514,895 A | | 5/1985 | Nishimura |
| 4,592,799 A | * | 6/1986 | Hayafuji ...................... 117/45 |
| 5,145,808 A | | 9/1992 | Sameshime et al. |
| 5,365,875 A | | 11/1994 | Asai et al. |
| 5,432,122 A | | 7/1995 | Chae |
| 5,454,347 A | | 10/1995 | Shibata et al. |
| 5,496,768 A | | 3/1996 | Kudo |
| 5,529,951 A | | 6/1996 | Noguchi et al. |
| 5,533,040 A | | 7/1996 | Zhang |
| 5,591,668 A | | 1/1997 | Maegawa et al. |
| 5,683,935 A | | 11/1997 | Miyamoto et al. |
| 5,767,003 A | | 6/1998 | Noguchi |
| 5,815,494 A | | 9/1998 | Yamazaki et al. |
| 6,242,291 B1 | * | 6/2001 | Kusumoto et al. .......... 438/158 |
| 6,274,414 B1 | | 8/2001 | Ogata et al. |
| 6,355,940 B1 | * | 3/2002 | Koga et al. ................... 257/59 |

FOREIGN PATENT DOCUMENTS

| | | |
|---|---|---|
| JP | HEI 4-102311 | 4/1992 |
| JP | HEI 8-51074 | 2/1996 |
| JP | HEI 8-217424 | 8/1996 |

OTHER PUBLICATIONS

Mamoru Furuta et al., "Bottom–Gate Poly–Si Thin Film Transistors Using XeCI Excimer Laser Annealing and Ion Doping Techniques," IEEE Transactions on Electron Devices, vol. 40, No. 11, Nov., 1993.

* cited by examiner

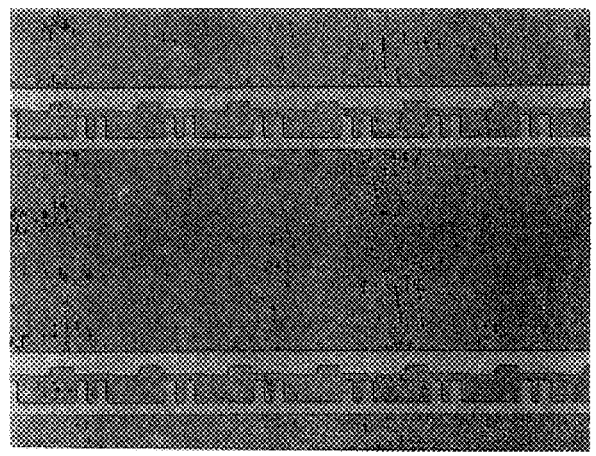
Fig. 22A  390mJ/cm² ×250
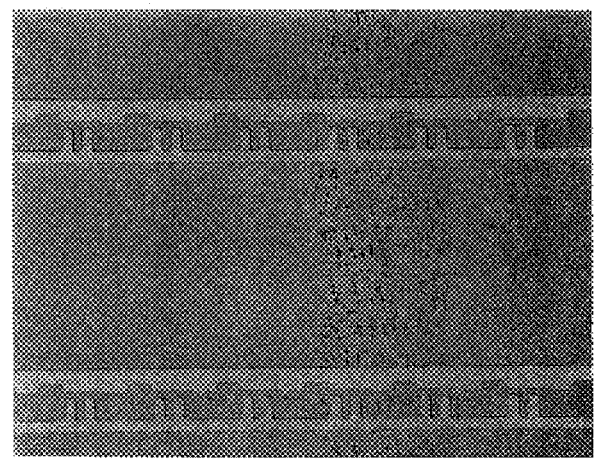
Fig. 22B  400mJ/cm² ×250
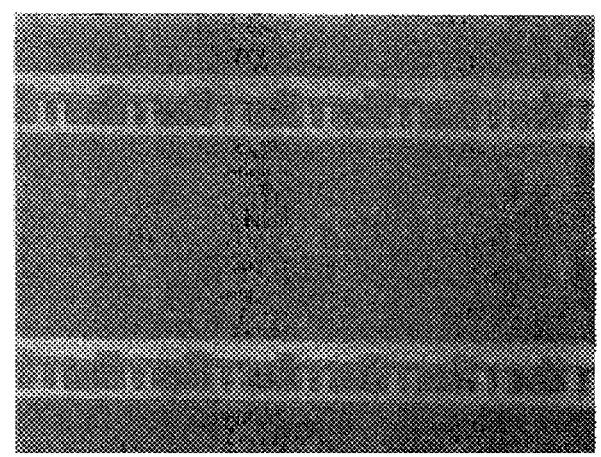
Fig. 22C  410mJ/cm² ×250

390mJ/cm²

400mJ/cm²

410mJ/cm²

390mJ/cm²

400mJ/cm²

410mJ/cm²

390mJ/cm²     x250

400mJ/cm²     x250

410mJ/cm²     x250

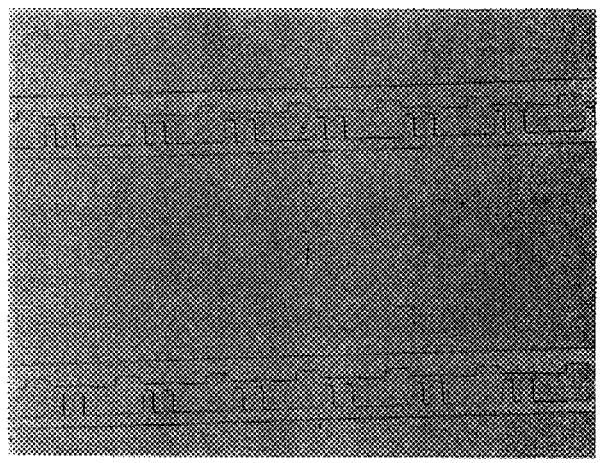
Fig. 28A  390mJ/cm² ×250
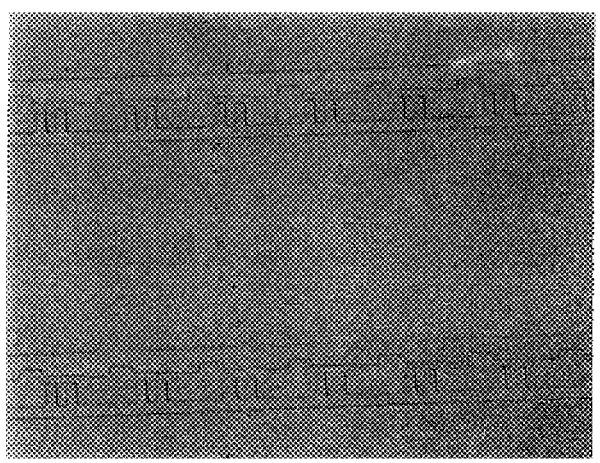
Fig. 28B  400mJ/cm² ×250
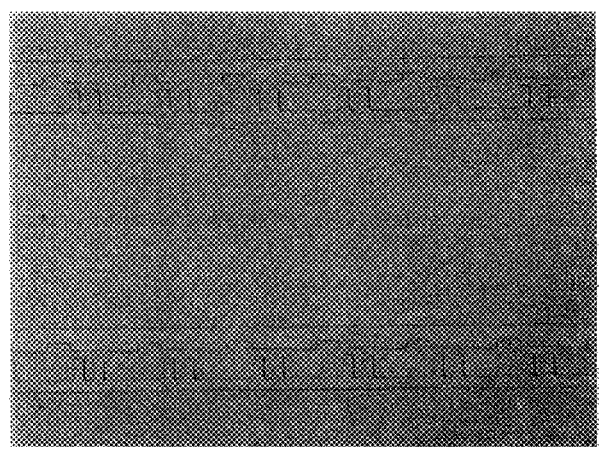
Fig. 28C  410mJ/cm² ×250

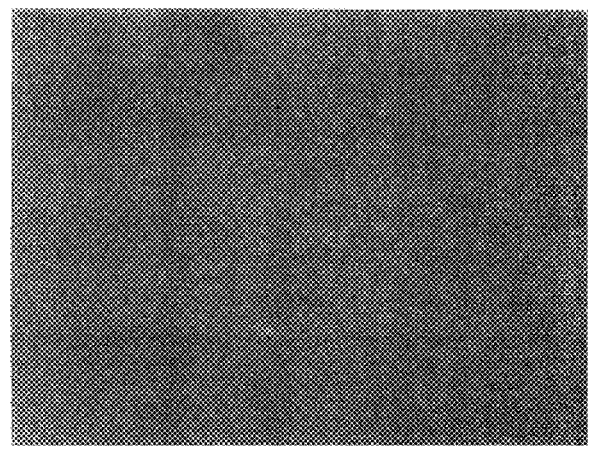
Fig. 29A  390mJ/cm² ×250
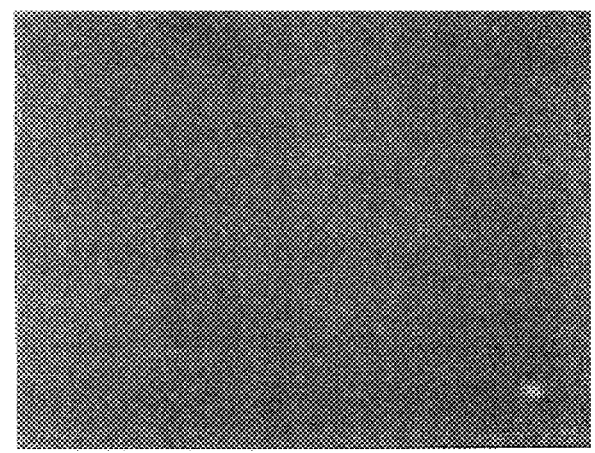
Fig. 29B  400mJ/cm² ×250
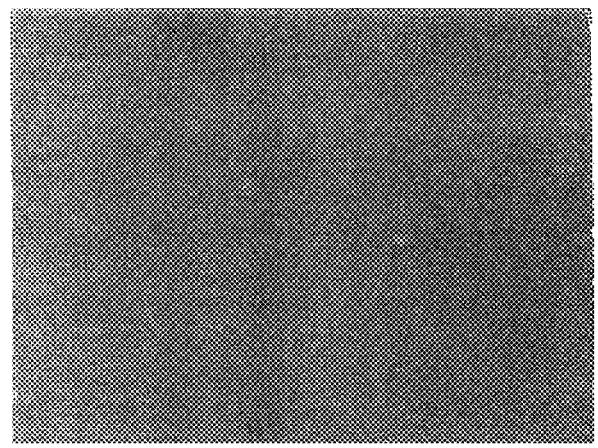
Fig. 29C  410mJ/cm² ×250

LASER ANNEAL METHOD OF A SEMICONDUCTOR LAYER

This application is a continuation of Ser. No. 09/291,538 Apr. 14, 1999 abandoned, which is a division of Ser. No. 08/911,505 filed Aug. 14, 1997 U.S. Pat. No. 6,274,414.

BACKGROUND OP THE INVENTION

1. Field of the Invention

The present invention relates to a method for manufacturing a semiconductor device, particularly to a method for manufacturing an LCD (liquid crystal display) such as a driver circuit integrated type LCD in which TFTs (thin film transistors) comprising a polycrystal semiconductor layer are formed in a display area and a driver area.

2. Description of the Related Art

In recent years, LCDs have been regularly employed in OA and AV apparatuses because of advantages resulting from their small size and thickness and their low power consumption. Active matrix type displays, in which each pixel is equipped with a TFT as a switching device for controlling the rewrite timing of image data, are especially able to display moving pictures with high resolution on a large screen, and are therefore used for displays in various televisions, personal computers, and the like.

A TFT is an FET (field effect transistor) obtained by forming a semiconductor layer together with a metal layer in a predetermined shape on an insulating substrate. In an active matrix type LCD, each TFT is connected to an electrode of each pixel capacitor formed between a pair of substrates, for driving liquid crystal.

In particular, developments have been made to LCDs using polycrystal silicon (p-Si) as a semiconductor layer in place of amorphous silicon (a-Si) which has previously been common, and annealing with use of a laser beam has been put to use for formation or growth of crystal grains of p-Si. In general, p-Si has a higher mobility than a-Si so that using p-Si to form a TFT can downsize TFTs, allowing a high aperture ratio and a high resolution to be realized. In addition, since TFTs can be constructed in a gate self-alignment structure, fine TFT elements can achieve higher speed operation by reductions in parasitic capacity. By using these TFTs to form an electric complementary connection structure between an n-ch TFT and a p-ch TFT, i.e., a CMOS, a higher speed driver circuit can be constructed. Therefore, a driver circuit section can be formed to be integrated with a display pixel section on one substrate, allowing manufacturing costs to be reduced and realizing a small size LCD module.

Known methods of forming a p-Si layer on an insulating substrate include a crystallization method under a high temperature, by annealing a-Si formed under a low temperature, a solid phase crystallization method under a high temperature, and the like. In all known methods, some treatment must be carried out under a high temperature of 900° C. or more. Therefore, it is not possible to use a low cost non-alkaline glass substrate as an insulating substrate in view of heat resistance and, as quartz glass substrate is required, a higher manufacturing cost results. In contrast, developments have been made to a method which allows use of a non-alkaline glass substrate as an insulating substrate by performing silicon polycrystallization processing at a relatively low substrate temperature of 600° C. or less, through use of laser annealing. Such processes, in which the processing temperature is 600° C. or less throughout all TFT manufacturing steps are called "low-temperature processes", and are essential for mass-production of low cost LCDs.

FIG. 1 shows a state of a substrate to be processed by excimer laser annealing (hereinafter referred to as "ELA"). A substrate 1 to be processed is a popular non-alkaline glass substrate. An a-Si layer is formed on the surface of the substrate 1. An active matrix substrate 5 is a substrate for constructing an LCD comprising a display area 2 where display pixels are arranged in matrix, and a gate driver 3 and a drain driver 4 provided surrounding the display area 2. The substrate 1 is a mother glass substrate including a plurality of active matrix substrates 5. In the display area 2, pixel electrodes, each being an electrode of a pixel capacitor for driving liquid crystal, are formed and arranged in matrix, and are respectively connected with TFTs formed. The gate driver 3 is mainly constructed by a shift register, and the drain driver 4 is mainly constructed by a shift register and a sampling circuit. These drivers are formed by a TFT array such as a CMOS or the like.

Each of TFTs is formed such that, as shown in FIG. 2, a p-Si layer obtained by crystallization of an a-Si layer by use of the ELA method is used as an active layer. In the area where a p-Si layer 11 etched into an island-like shape is formed, a non-doped channel region CH, light-doped regions LD, and heavy-doped source and drain regions S, D are arranged. On the channel region CH, a gate electrode 13 is arranged with a gate insulating film interposed between the channel region and the gate electrode 13. A source electrode and a drain electrode are connected to the source and the drain regions respectively. In the driver circuit areas, a TFT is connected to form a CMOS or the like. In a display area, a signal line and a pixel electrode are connected to the respective drain electrode and the source electrode.

As shown in FIG. 1, in a conventional laser annealing method, a line beam is irradiated on a substrate 1 such that the contour of edge lines C of a band-like irradiated region of a line beam irradiated on the substrate 1 is shifted by a predetermined overlap amount. Scanning is carried out as indicated by the arrow in the drawing, and the entire substrate is subjected to annealing. However, after scanning is thus performed with a line beam, there remains a defective crystallization region in which sufficient crystallization was not attained and grains with a smaller grain size, as indicated by reference R in the figure, remain in p-Si formed. This region is formed in a fine liner shape along the longitudinal direction of the irradiated region, and appears in a striped pattern. Since this defective crystallization region R has a low mobility and a high resistance, the characteristics of TFTs formed in this region are degraded. If the characteristics of TFTs are thus degraded, pixel capacitors are not sufficiently charged in the display area so that the contrast ratio is lowered, or erroneous operation is caused in the driver circuit area, thus disadvantageously influencing display.

It is estimated that a defective crystallization region as described above is caused because of unevenness in energy of an irradiated laser beam. Laser annealing strongly depends on the energy of the irradiated laser beam. In general, the grain size of crystal tends to increase as the irradiation energy increases. However, when the energy level increases to a certain level Eu or more, the grain size rapidly decreases to the microcrystal level. Hence, it is demanded that the energy level of a laser beam to be irradiated onto an a-Si layer should be as large as possible within a range of Eu to Ed which is lower than an upper limit level Eu such that the energy level does not exceed the upper limit Eu, in order to enlarge the grain size as much as possible thereby to achieve TFTs having excellent characteristics.

FIG. 3 shows an energy distribution of an irradiation beam with respect to positions in a line beam. An optical system for generating a line beam is provided with a line width adjust slit and a line length adjust slit, to form a line beam of a band-like or rectangular shape. Thus, since the line width A of the line beam is defined by the line width adjust slit, the characteristic curve of the irradiation light intensity distribution has substantially sharp edges and a substantially flat energy distribution peak portion Eo, as shown in FIG. 3. However, in legions X and B in FIG. 3, the energy level is extremely high or low and is thus greatly differs from the level at the flat portion.

In an optical system comprising a plurality of lenses, light is diffracted or interfered due to slight concave and convex portions existing in the lens surfaces or foreign material contamination or the like adhering thereto. The light thus diffracted or interfered is converged in the line width direction A and is expanded in the line length direction, so that nonuniformity of energy of the laser beam irradiated toward the substrate 1 from the optical system is increased. Even slight amounts of foreign material or the like present in a clean room, may cause nonuniformity in light intensity. Therefore, nonuniformity of the output energy of a line beam cannot be completely eliminated at present, and it is unavoidable that the energy level of a line beam to be irradiated partially exceeds the upper limit which allows an appropriate grain size.

As a result of this, a line beam whose energy level is uneven is intermittently irradiated as shown in FIG. 3, and a laser beam which partially exceeds the upper limit Eu of the energy level is irradiated within a unit irradiated region having edge lines C as shown in FIG. 1. It is therefore considered that a much finer linear defective crystallization region R is caused within the edge lines C.

SUMMARY OF THE INVENTION

The present invention has an object of providing a method of preventing nonuniformity in semiconductor layer characteristics and of obtaining a semiconductor layer with excellent characteristics by means of laser anneal processing.

To achieve the above object, the present invention provides a laser anneal method for improving quality of a semiconductor layer formed on a substrate by irradiating a laser beam or for obtaining a polycrystal semiconductor layer from an amorphous semiconductor layer, wherein an energy level of the laser beam in a region to be irradiated is set such that a level towards the rear of the region along which the laser beam scans is lower than that at the front area or the center area of the region.

Thus, after a high energy part of the laser beam at a relatively forward part with respect to the scan direction passes through the semiconductor layer, a lower energy part passes through the semiconductor layer sequentially. Therefore, after large crystal grains are initially formed by the high energy part, remaining defective crystallization regions are crystallized by the relatively low energy part while the large crystal grains are maintained, thereby improving crystallinity for the entire region.

In another aspect, the present invention provides a laser anneal method of a semiconductor layer for obtaining a polycrystal semiconductor layer by irradiation of an amorphous semiconductor layer formed on a substrate with a laser beam, wherein an energy level at a region to be irradiated by the laser beam is set such that the peak level in the rear area of the region along a scan direction of the laser beam is lower than the upper limit the energy level that maximizes the semiconductor layer grain size.

Thus, the irradiated energy does not exceeds the upper limit energy level which maximizes the grain size at the rear area of the irradiated laser beam along the scan direction passing over the amorphous semiconductor layer sequentially, therefore it is possible to prevent the semiconductor layer from being changed into an amorphous state, and to carry out crystallization with defective crystallization regions. Accordingly, a polycrystal semiconductor layer having an almost uniform grain size over the entire region of the semiconductor layer can be formed.

In a further aspect, in addition to the above-described condition, the peak level of the laser beam at the front area or the center area of the region is substantially equal to or more than the upper limit energy level which maximizes the grain size of the semiconductor layer.

In yet another aspect of the present invention, the upper limit energy level which maximizes the grain size of the semiconductor layer is corresponds to the lower limit energy level over which the polycrystal semiconductor layer is changed into an amorphous state.

Thus, the level of the irradiated laser beam passing over the semiconductor layer exceeds the upper limit energy level in some cases because the energy level at the front area is relatively high, allowing the semiconductor layer to be microcrystallized by such a laser beam. However, the energy level irradiated to the semiconductor layer gradually decreases as the laser beam scanning proceeds from the front area to the rear area because the energy level is set such that a level at the rear area is lower than that at the front, which allows the energy level irradiated to the semiconductor layer to not exceed the upper limit energy level and to yet be sufficiently high and optimal. The latter half of the laser annealing process for a predetermined region of the semiconductor layer is performed in an energy range in which a sufficiently large grain size can be formed by employing such an energy profile of the laser beam, because an energy range which is optimal to maximize the grain size is just below the upper limit. Therefore, the laser anneal processing is performed under the best conditions. As a result, a polycrystal semiconductor layer with a large grain size and excellent uniformity is formed.

According to another aspect of the present invention, the laser beam irradiated on the amorphous semiconductor layer is obtained by shaping a laser beam generated from a laser oscillation source by an optical system including a plurality of lenses, such that the region to be irradiated has a predetermined shape, and the energy level, energy distribution, or their combination in the region to be irradiated by the laser beam is controlled by adjusting a distance between the amorphous semiconductor layer formed on the substrate and the focal point of the laser beam formed by the optical system.

By thus controlling the distance between the substrate on which the amorphous semiconductor layer is formed and the focal point of the laser beam formed by the optical system, the energy profile of the laser beam is easily modified in a desired shape, thereby allowing a better laser anneal processing to be performed by a simple control.

According to yet another aspect of the present invention, the scan direction of the laser beam is set such that an energy level at the rear area of the region along the scan direction is lower than the upper limit energy level, which allows the laser profile along the scan direction to be more simple and suitable.

In another aspect, the present invention is a transistor device in which a polycrystal semiconductor layer is formed by subjecting an amorphous semiconductor layer formed on a substrate to laser anneal processing, wherein an energy level in a region to be irradiated by a laser beam of the amorphous semiconductor layer is set such that the level at the rear area of the region along a scan direction of the laser beam is lower than the upper limit energy level which maximizes a grain size of the semiconductor layer, and the amorphous semiconductor layer is annealed by the laser beam and the polycrystal semiconductor layer obtained is used as an active layer of the transistor device.

According to yet another aspect of the present invention of the transistor device; the transistor device is a thin film transistor, and a channel layer of this thin film transistor is formed in the polycrystal semiconductor layer obtained by the laser anneal processing.

In a further aspect of the present invention, the transistor device is a thin film transistor, a channel layer of this thin film transistor is formed in the polycrystal semiconductor layer obtained by the laser anneal processing, and the thin film transistor is used as a switching device formed in a display area of a substrate forming a liquid crystal display and as a switching device of a driver circuit formed surrounding the display area of the substrate through a process substantially equal to a process of forming the switching device of the display region.

By thus controlling the laser energy to form a polycrystal semiconductor layer and by using the layer as an active layer of a transistor device, for example a thin film transistor, it is possible to obtain a transistor device with a high speed and excellent characteristics. Further, since a polycrystal semiconductor layer having excellent characteristics is obtained, it is possible to form a transistor device having a gate-self-align structure. If this kind of transistor is used as a switching device of a display area and as a switching device of a driver circuit area for driving the switching device of the display area in the liquid crystal display or the like, it is possible to form a display with excellent display quality.

BRIEF DESCRIPTION OF THE DRAWINGS

The patent or application file contains at least one drawing executed in color copies of this patent or patent application publication with color drawing(s) will be provided by the U.S. Patent Trademark Office upon request and payment of the necessary fee.

FIGS. 22A, 22B and 22C are views showing microphotographs of a p-Si layer when the scan direction of a laser beam shown in FIG. 21 is set in the left direction in FIG. 21.

FIGS. 28A, 28B and 28C are views showing microphotographs of a p-Si layer when the scan direction of a laser beam shown in FIG. 27 is set in the left direction in FIG. 27.

FIGS. 29A, 29B and 29C are views showing microphotographs of a p-Si layer when the scan direction of a laser beam shown in FIG. 27 is set in the right direction in FIG. 27.

DESCRIPTION OF THE PREFERRED EMBODIMENTS

Figure 4:
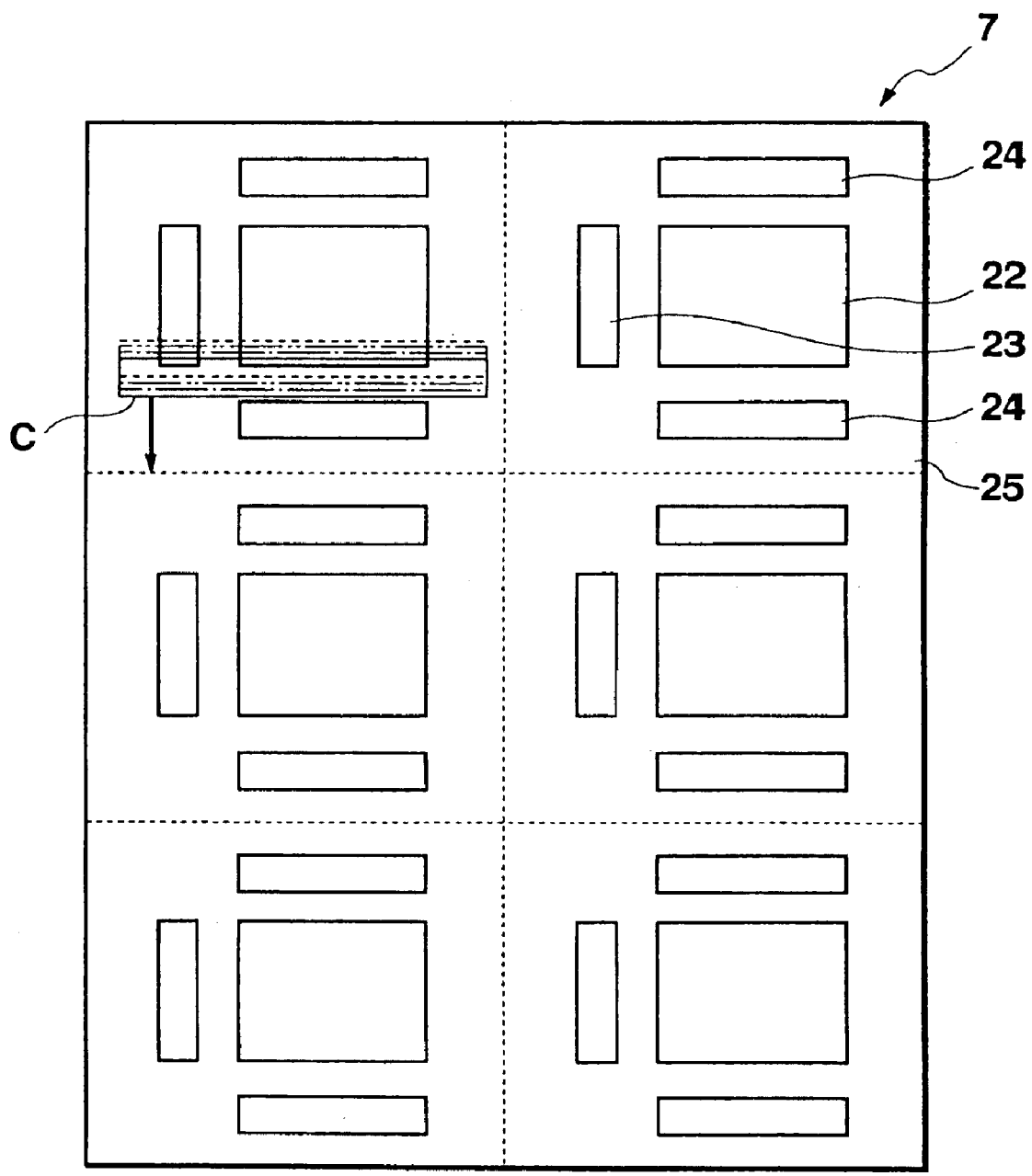
FIG. 4 is a view explaining a positional relationship between a substrate to be processed and a region to be irradiated by a line beam according to an embodiment of the present invention.

FIG. 4 is a plain view for showing a state of a substrate to be processed by an ELA according to an embodiment of the present invention. The substrate 7 to be processed is a popular non-alkaline glass substrate, and an a-Si layer is formed on its surface. An active matrix substrate 25 forms one substrate of an LCD comprising a display area 22 where display pixels are formed and arranged in matrix, and a gate driver 23 and a drain driver 24 formed and arranged surrounding display area 22. The substrate 7 is a mother glass substrate including six active matrix substrates 5. In the display area 22, pixel electrodes, each being an electrode of a pixel capacitor for driving liquid crystal, are arranged in matrix and each TFT is formed to be connected with each respective pixel electrode. The gate driver 23 is mainly constructed by a shift register, and the drain driver 24 is mainly constructed by a shift register and a sampling circuit. These drivers are formed by a TFT array such as a CMOS or the like, and each TFT is formed with use of p-Si formed by the ELA method according to the present invention, as a channel and a source/drain layer.

In an embodiment of the present invention, ELA is performed by irradiating a line beam obtained from a laser irradiation apparatus, as will be described below, onto a substrate 7 as a substrate to be processed, to scan the substrate with the beam. An excimer laser is a pulse laser, and a line beam of the pulse laser is intermittently irradiated onto the substrate 7 to be processed such that the substrate 7 is scanned in the direction indicated by the arrow in FIG. 4 (corresponding to the longitudinal direction in the figure) with the line beam. Further, the line beam is controlled such that irradiated regions of any successive pulse beams overlap each other by a predetermined amount (See edge lines C in the figure.) The entire surface of an amorphous semiconductor layer on the substrate 7 is annealed by scanning the substrate 7 while thus sequentially shifting the position of the line beam to be irradiated.

A line beam generated by a laser irradiation apparatus, to be described below, has an approximate line length of 80 to 300 mm and a line width of 0.1 to several mm.

Scanning is performed such that the line beam is moved as described above in the line width direction on the substrate 7, and is carried out for each active matrix substrates 25 arranged in a plurality of columns (e.g., in two columns in FIG. 4) on the substrate 7 to be processed as a mother substrate. In this manner, annealing is performed once on the entire surface of the substrate 7 to be processed.

An energy profile of a line beam, according to the present embodiment, for obtaining polycrystal silicon with a preferable grain size is next explained referring to FIGS. 5 to 8. The present embodiment is based on the fact that a final grain size of a film is influenced by an energy level at the latter half of the laser anneal processing, and employs a line beam having an energy profile suitable for an annealing process in an energy range which maximizes the grain size.

Figure 5:
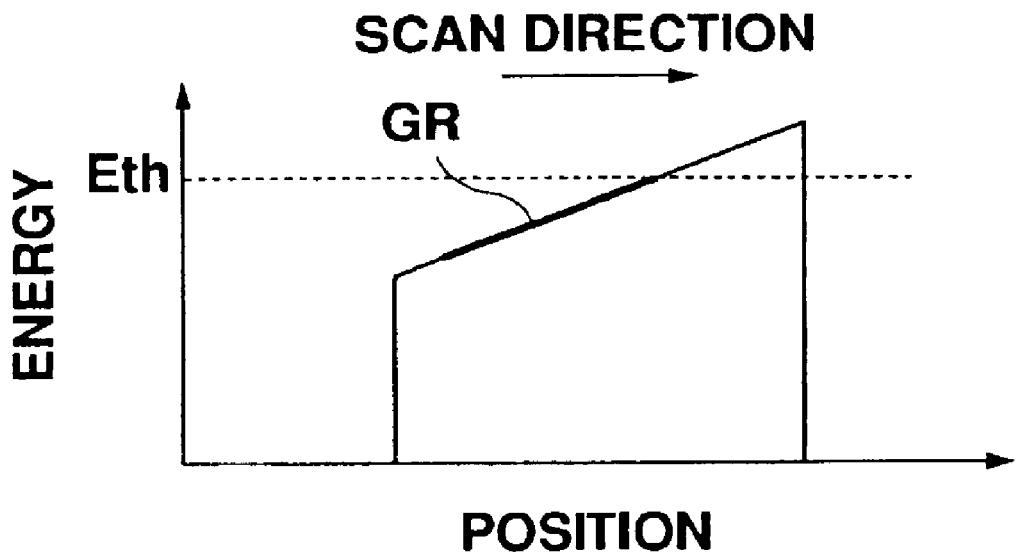
FIGS. 5, 6, 7 and 8 are graphs explaining an energy profile of a line beam according to an embodiment of the present invention.
Figure 6:
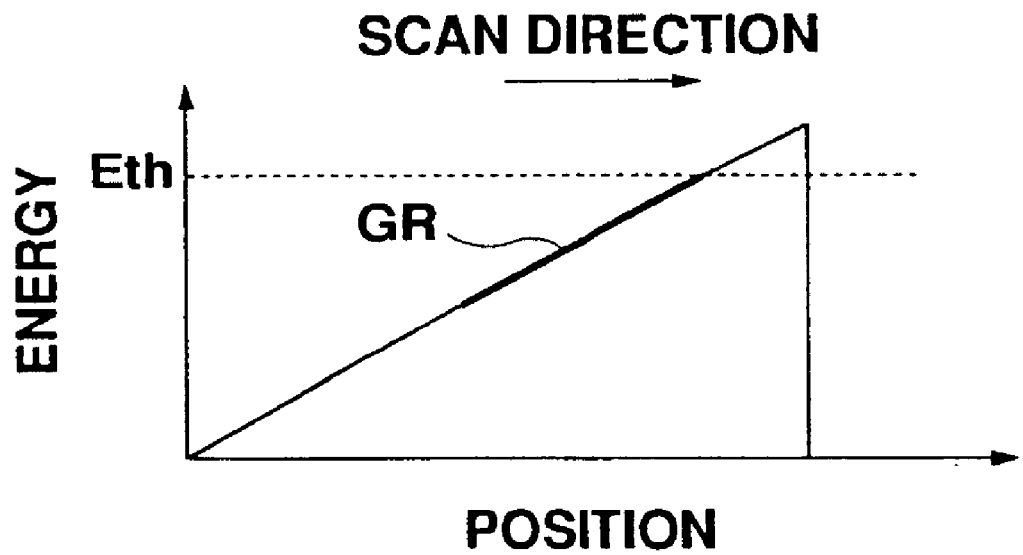
Figure 7:
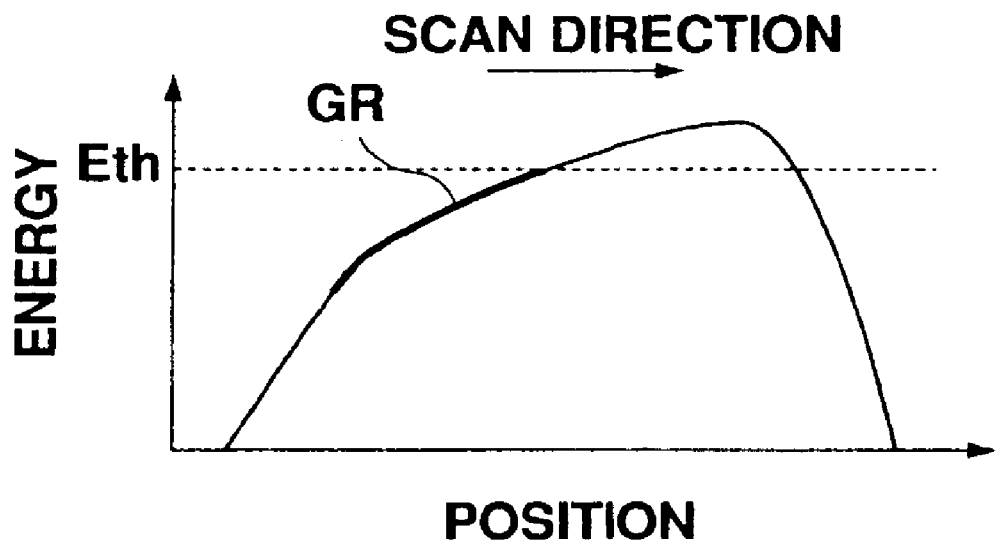
Figure 8:
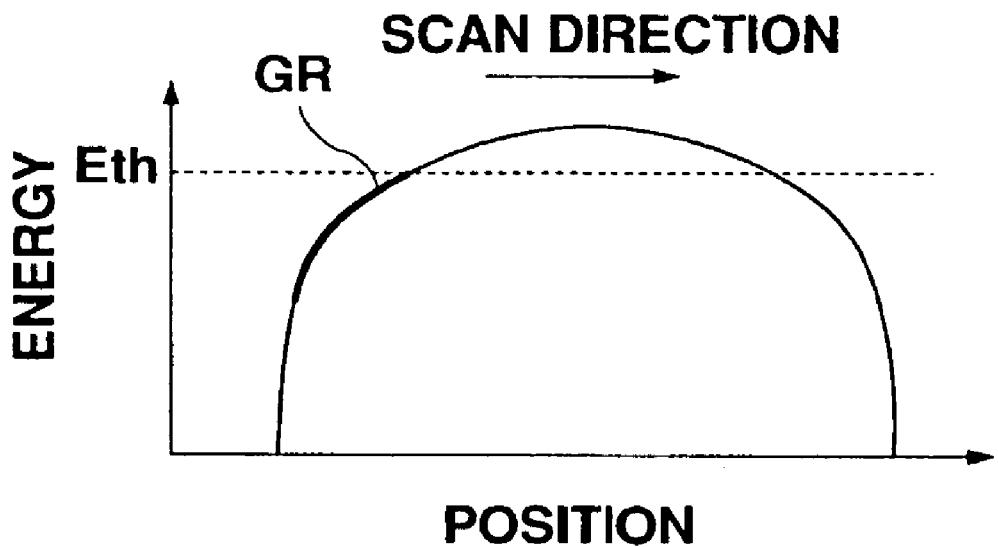

FIGS. 5 to 8 are energy profiles devised from such a point of view, and each of the figures shows a relation between a position of a irradiated line beam (a sheet beam) along the line width direction and an energy level. FIG. 5 is an example where a beam profile is shaped in a trapezoid in which a level at the front area with respect to the scan direction is different from the rear area. FIG. 6 is an example where an edge of a beam profile shaped in a trapezoid is shaded off. FIGS. 7 and 8 are examples of cases where that beam profiles are not as clearly defined as in FIGS. 5 and 6. In all of the examples, the energy level exceeds the threshold value energy, Eth, over which a silicon grain is microcrystallized in a line beam area corresponding to the front area along a scan direction of the line beam, i.e., the front area along the line width direction. However, the energy profile has a shape that the energy level does not exceed the threshold value energy Eth in the backward area relative to the front area. Therefore, it is possible to Anneal an amorphous silicon in an energy range GR which is optimal for obtaining a sufficiently large grain size and exists just below the threshold value energy Eth, which allows the laser anneal processing for crystallization to be performed in the optimal conditions.

Figure 9:
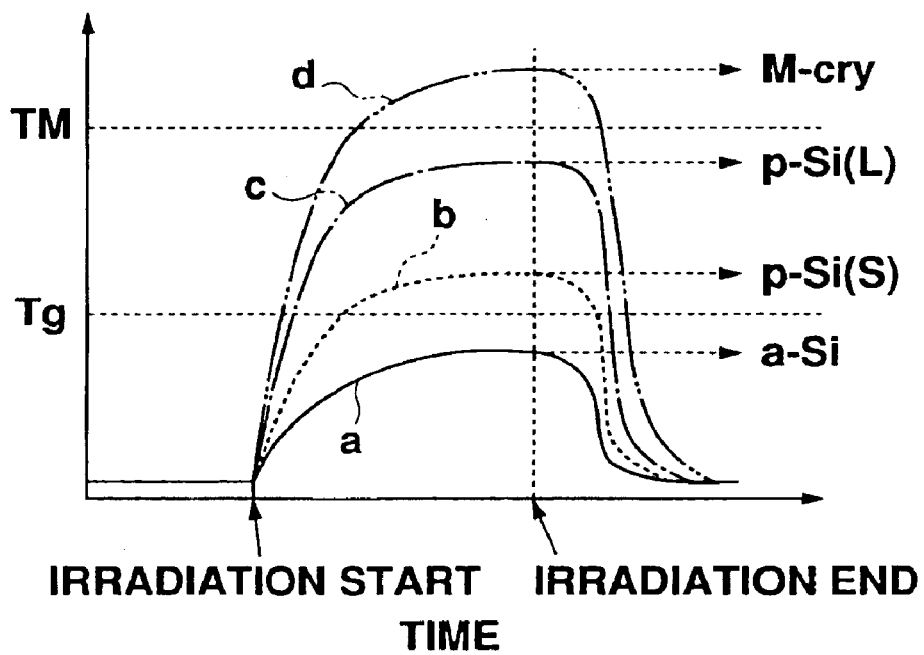
FIG. 9 is a graph showing a relation between laser beam irradiation time (the number of pulse shots) and temperature of a film to be processed in the ELA according to an embodiment of the present invention.

FIG. 9 shows a relation where crystallinity depends on a film temperature when a laser beam is irradiated. Temperature is measured by a well-known crystal lattice state optical observation method, such as a method using a pyrometer, and relates to energy of the ELA. In this figure, a manner of crystallization of an a-Si layer as a starting film is shown. According to this manner, the film temperature rises as time passes after irradiation begins, and the film temperature falls after irradiation stops. With regard to the curve "a" in the figure, the maximum attainment point of the film temperature does not exceed the polycrystallizing temperature Tg, therefore, even after the irradiation ends, the film temperature being lowered and crystallization being inactive, the state of the a-Si layer is maintained as it is. With regard to the curve "b", the maximum attainment point of the film temperature exceeds the polycrystallizing temperature Tg, therefore, after irradiation ends, the film temperature is lowered and crystallization is inactive, and a p-Si(S) film with small size grains is formed. With regard to the curve "c", the maximum attainment point of the film temperature is higher than the curves "a" and "b", therefore, a p-Si(L) film with large size grains is formed. With regard to the curve "d", the film temperature exceeds the polycrystallizing temperature Tg and the microcrystallizing temperature TM over which a grain size becomes small, therefore, after irradiation ends, film temperature is lowered and crystallization becomes inactive, causing a microcrystalline silicon (M-cry) film to form. The difference of "a", "b", "c", and "d" is caused by ELA energy. Accordingly, it is understood that the film temperature should be raised as high as possible such that the temperature does not exceed the microcrystallizing temperature TM, for obtaining a p-Si(L) film having large grain size and satisfactory annealing.

Figure 10:
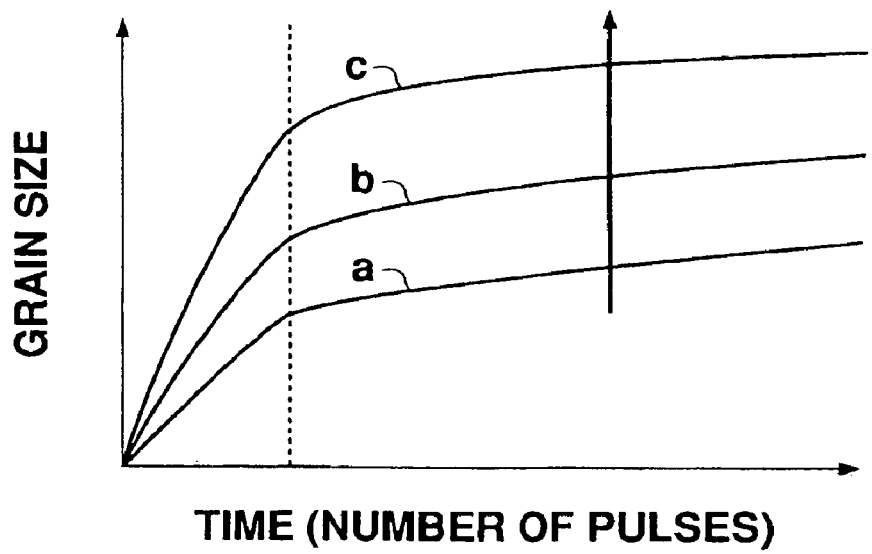
FIG. 10 is a graph showing a relation between laser beam irradiation time (the number of pulse shots) and a grain size of a film to be processed in the ELA according to an embodiment of the present invention.

FIG. 10 shows a relation between irradiation time, specifically the number of irradiated laser pulse shots, and grain size. The grain size increases as the number of pulse shots and an ELA energy increase, in a condition that the film temperature is equal to or less than the microcrystallizing temperature TM shown in FIG. 9. The grain size rapidly increases over the initial several shots, and gently increases by the succeeding shots.

This ELA property was derived from experimental results as described below.

Figure 11:
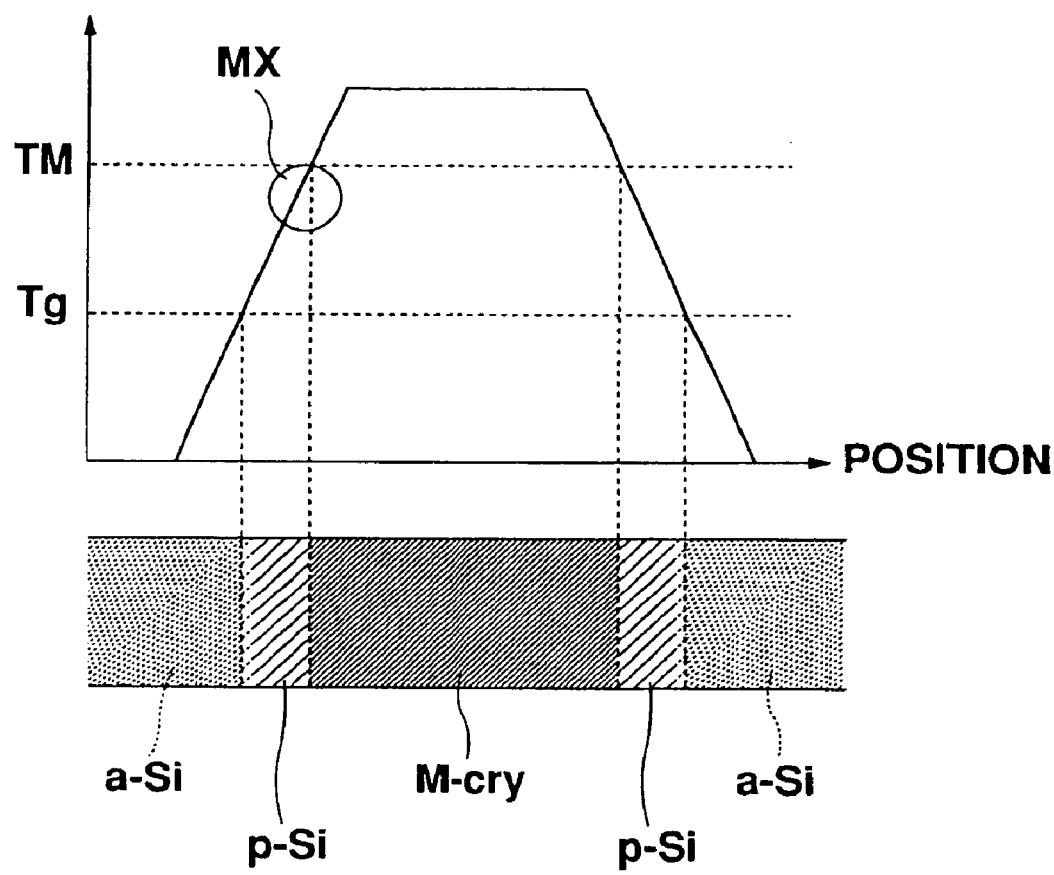
FIG. 11 is a view showing a correlation between beam profile and state of a film to be processed in an ELA according to an embodiment of the present invention.

A p-Si layer formed by the ELA with relatively high energy, as will be described in detail later, was first Secco etched. Its film state was then examined using an SEM, an optical microscope, and other means. As a result, an ELA property as shown in FIG. 11 was found. The upper section of the figure is a beam profile showing a relation between laser irradiation position and energy, wherein the horizontal axis [Position] refers to a position along the width direction of a line beam or a scan direction of the beam, and the vertical axis [Temperature] refers to film temperature, having a relation to the laser energy, measured by optical observation of a lattice state. The lower section of the figure is a view showing a layer state, processed by the ELA, corresponding to the beam profile. The beam profile is shaped in a trapezoid in which the temperature level at the top of the profile exceeds the microcrystallizing temperature TM, therefore a film corresponding to the top is in a microcrystal (M-cry) state. At the sides of the trapezoidal profile having a steep slope with a straight line or a smooth curved line, the film temperature rises and exceeds the polycrystallizing temperature Tg and the microcrystallizing temperature TM, as nearer the central part of the region to be irradiated by the laser beam along the width direction, the top of the trapezoidal profile, or the microcrystal region. The most outer part of the film corresponding to the temperature region equal to or less than the polycrystallizing temperature Tg of the beam profile is in an a-Si state, and the film corresponding to the temperature region from the polycrystallizing temperature Tg to the microcrystallizing temperature TM is in a p-Si state. A grain size of p-Si successively increased from the a-Si region, as the film temperature increased over the polycrystallizing temperature Tg shown in the profile. The most characteristic point was that the grain size increased according to temperature until temperature attained the microcrystallizing temperature TM, and then grain size rapidly decreased to be changed into microcrystal over the microcrystallizing temperature TM. As a result, the maximum grain size was obtained at the highest temperature region MX which does not exceed the microcrystallizing temperature TM.

Figure 12:
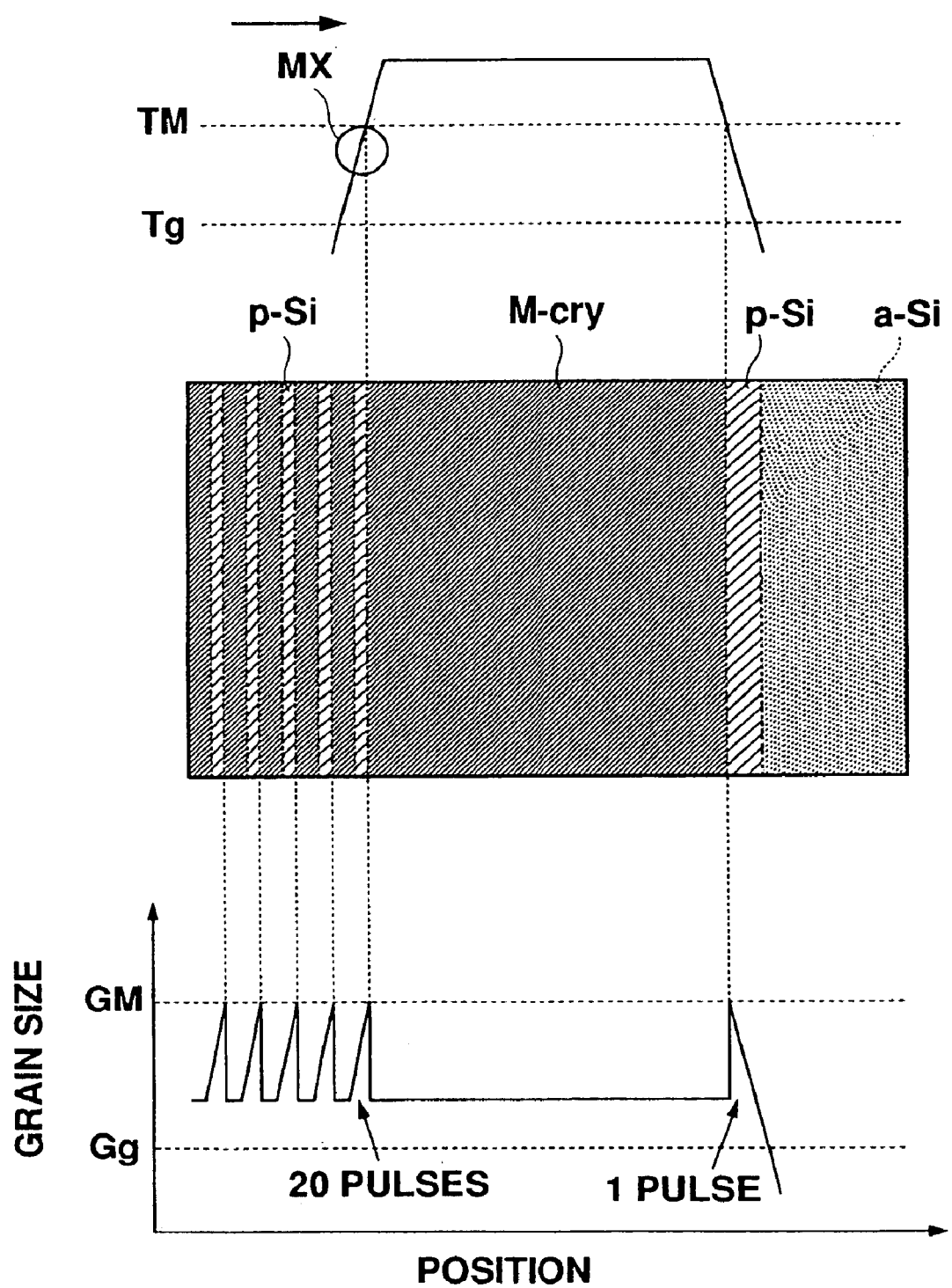
FIG. 12 is a view showing a correlation between a beam profile, a state of a film, a position in the film, and a grain size at a timing in the ELA according to an embodiment of the present invention.
Figure 13A:
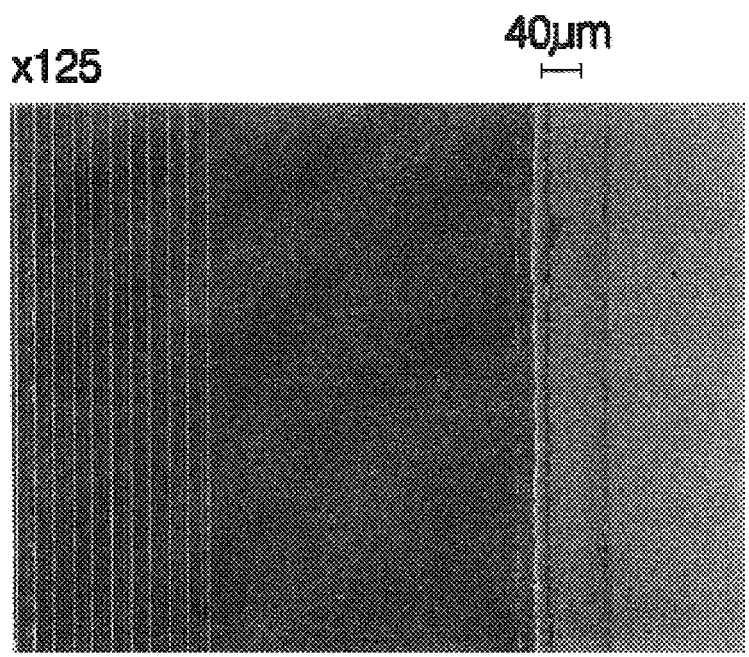
FIGS. 13A, 13B and 13C are views showing microphotographs showing the view of the state of a film shown in the middle section of FIG. 12.
Figure 13B:
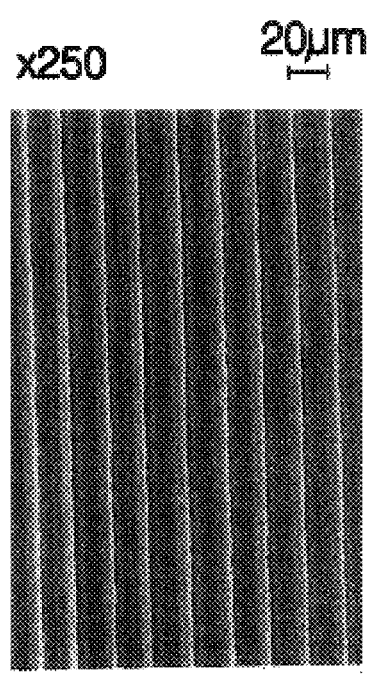
Figure 13C:
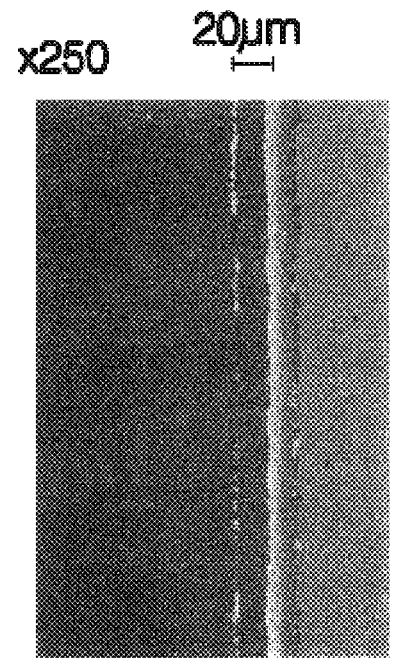

FIG. 12 is a view explaining a state of a processed film obtained by scanning a line beam having an energy profile as shown in FIG. 11 on the a-Si layer. The upper section of FIG. 12 is an energy profile of a laser beam identical to FIG. 11, the middle section of FIG. 12 is a schematic view of a state of the processed film obtained by laser annealling, and the lower section of FIG. 12 shows a relationship, connected with the middle section, between a film position corresponding to the processed film in the middle section along beam scan direction and grain size. FIG. 12 shows that an irradiated position is at the position shown in the figure as the beam proceeded while the irradiated position was sequentially shifted from the left side of FIG. 12. In this experiment, a scan of the line beam was set such that each laser pulse 95% overlapped each next pulse and twenty laser pulses were repeatedly scanned for a unit irradiated region in one instance. FIG. 13A is an optical microphotograph (magnification: ×125) of the processed film which is a base of the schematic view of a state of the film shown in the middle section of FIG. 12., FIG. 13B is an optical microphotograph (magnification: ×250) enlarging the left side region of FIG. 13A. FIG. 13C is an optical microphotograph (magnification: ×250) enlarging the right side region of FIG. 13A.

In each laser pulse, p-Si of a sufficiently large grain size GM was sequentially formed at a film corresponding to the MX region that is an edge part of the beam profile, while M-cry was formed at a temperature region over the temperature TM at the front area of the MX region of the energy profile with respect to the scan direction, thereby forming a striped pattern. In other words, it is understood that while M-cry formed by previous pulses is crystallized by succeeding pulses, fine linear p-Si is formed in the film region corresponding to the temperature region MX for obtaining the maximum grain size GM while in other regions, an energy level by which a grain size of M-cry can be more increased is not given. There is also an MX region for obtaining a sufficiently large grain size at a front edge part of the beam profile along the scan direction. However, M-cry is formed while the top of the beam profile thereafter passes through.

Figure 14:
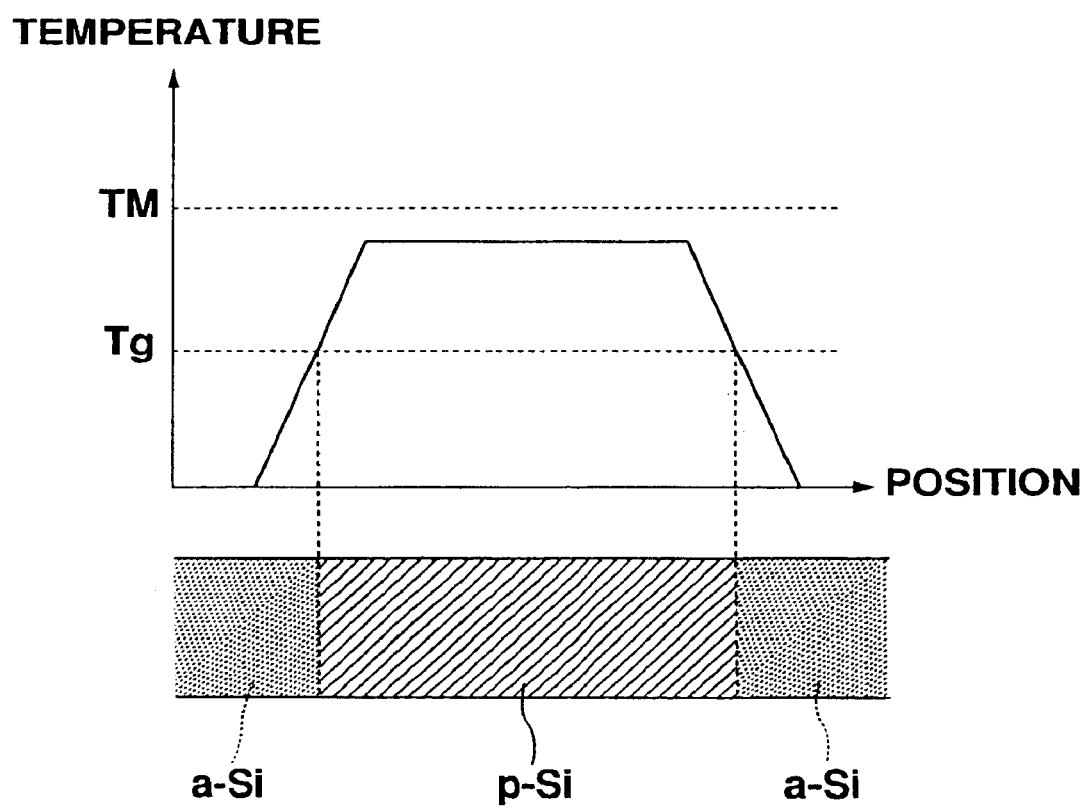
FIG. 14 is a view showing a correlation between beam profile and state of a film to be processed in an ELA according to an embodiment of the present invention.

A p-Si layer formed by relatively low energy ELA, in which the peak energy level of a line beam was set such that it was lower than the beam illustrated in FIG. 11, was Secco etched and its film state was examined using an SEM, an optical microscope, or the like, with a result as shown in FIG. 14. The upper section of the figure is, as was the case in FIG. 11, an energy profile against an irradiation position of a laser beam along a scan direction, and the lower section of the figure is a view shoving a state of a film processed by ELA obtained by irradiating a laser beam with this beam profile. While the beam profile is trapezoid shaped as in FIG. 11, the energy level of the line beam is set relatively low, therefore its top did not exceed the microcrystallizing temperature TM, which allowed ELA to be performed at a temperature region over the polycrystallizing temperature Tg. As a result, p-Si having a not very large grain size was formed. The state of a-Si was maintained in its prior state, under the polycrystallizing temperature Tg.

Figure 15:
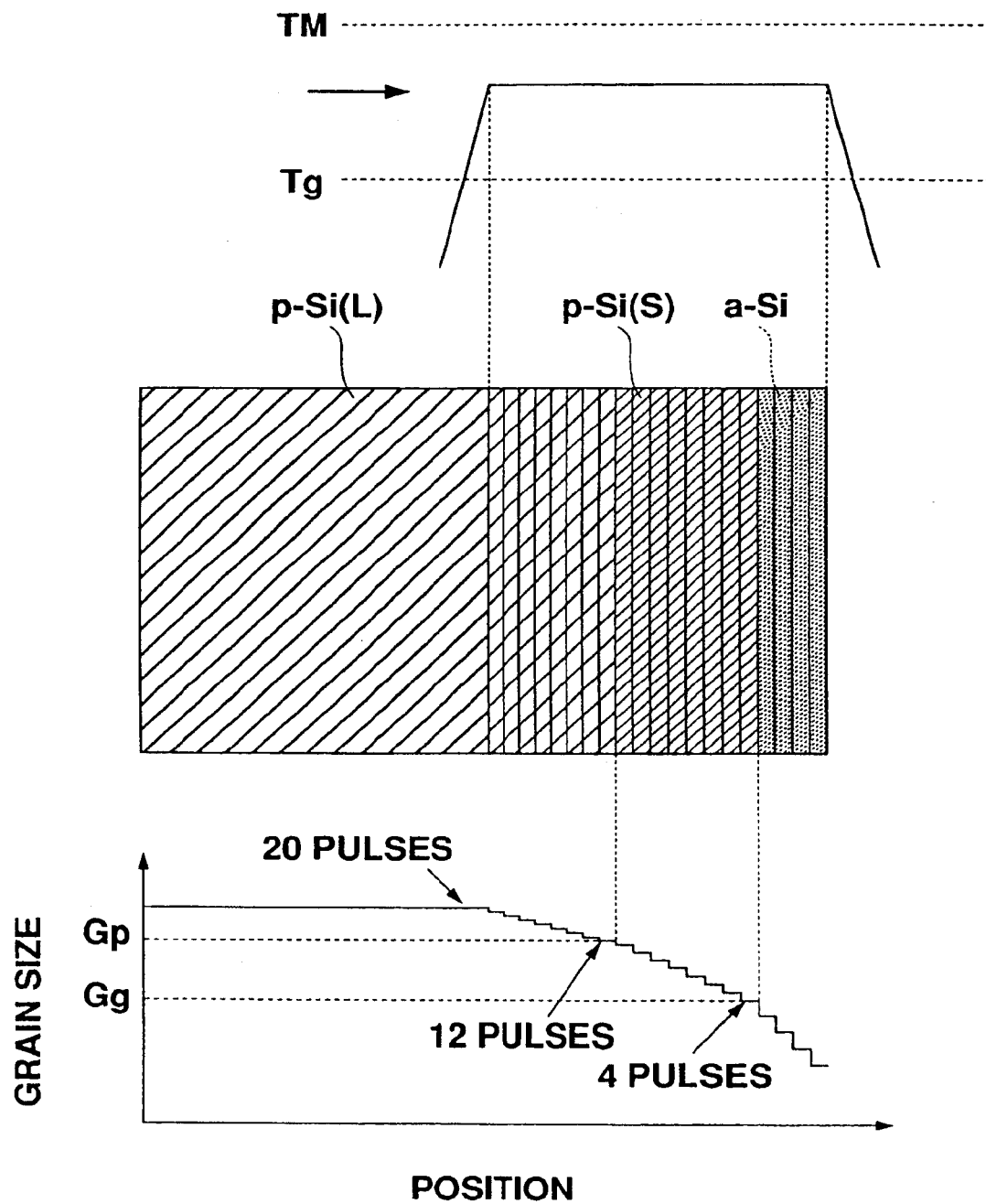
FIG. 15 is a view showing a correlation between a beam profile, a state of a film, a position in the film, and a grain size at a timing in the ELA according to an embodiment of the present invention.
Figure 16A:
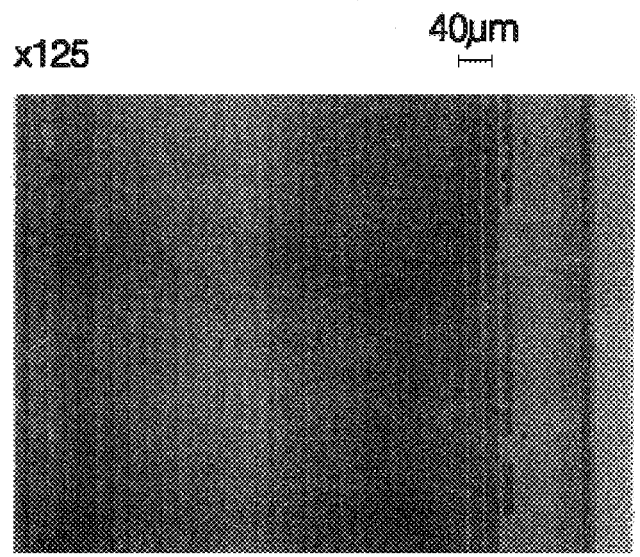
FIGS. 16A, 16B and 16C are views showing color microphotographs showing the state of a film shown in the middle section of FIG. 15.
Figures 16B, 16C:
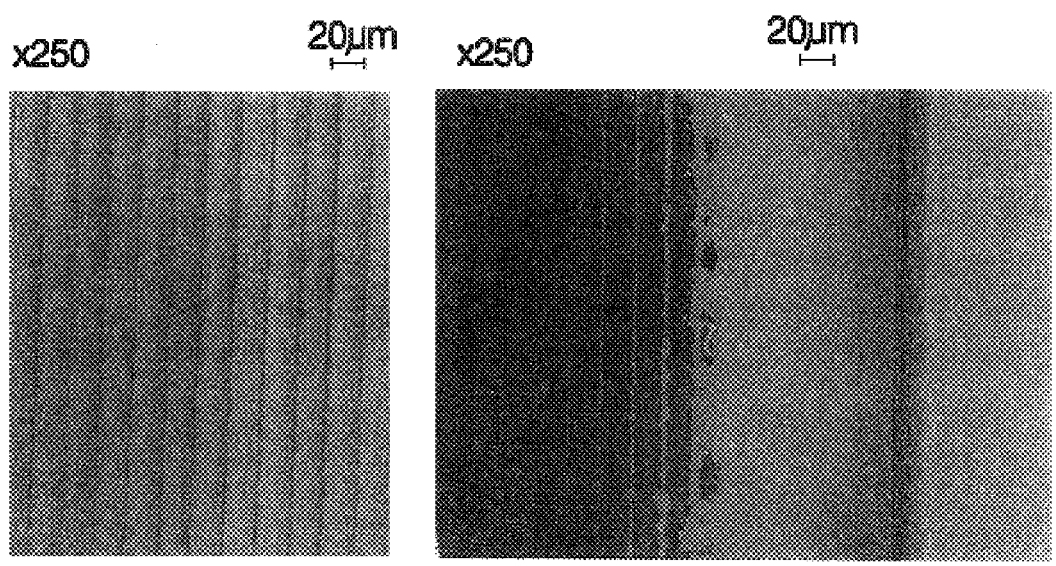

FIG. 15 is a view explaining a state of a processed film obtained by scanning the line beam having the energy profile shown in FIG. 14 on an a-Si layer. The upper section of FIG. 15 is an energy profile of a laser beam identical to FIG. 14, the middle section of FIG. 15 is a schematic view of a state of the processed film obtained by laser annealling, and the lower section of FIG. 15 shows a relation, corresponding to the number of laser shots, between a film position corresponding to the processed film in the middle section with respect to a scan direction of the beam and a grain size. FIG. 15 shows that an irradiated position is at the position shown in the figure at a time, in a condition that the line beam proceeds while the irradiated position is sequentially shifted from the left side of FIG. 15. In this experiment, a scan of the line beam was set such that each laser pulse 95% overlapped each other pulse and twenty total pulses per scan were repeatedly performed for a unit irradiated region. FIG. 16A is an optical microphotograph (magnification: ×125) of the processed film which is a base of the schematic view of a state of the film shown in the middle section of FIG. 15. FIG. 16B is an optical microphotograph (magnification: ×250) enlarging the left side region of FIG. 16A. FIG. 16C is an optical microphotograph (magnification: ×25.0) enlarging the right side region of FIG. 16A. At the conditions shown in FIGS. 15 and 16A to 16C, microcrystal was not formed by change into an amorphous state, because laser energy did not exceed the microcrystallizing temperature TM, which allowed crystallization to proceed as the number of pulses increased, thus enlarging the grain size.

An a-Si layer was crystallized by the initial four pulses to change the grain size into Gg and the grain size further gently increases as the number of pulses is increased. Finally, the grain size attained to the maximum size Gp obtained by ELA energy in this experiment at the 12th pulse. A large change in the grain size was not observed thereafter.

Figure 17:
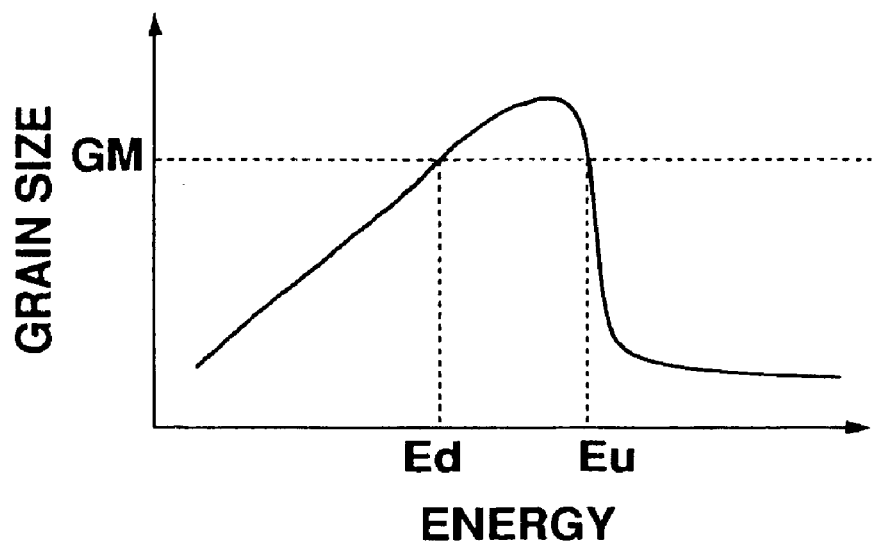
FIG. 17 is a graph showing a relation between laser energy and grain size in an ELA according to an embodiment of the present invention.

The following information was revealed by the above described experiments. In order to increase silicon grain size by ELA, an increase of an energy level was required. However, if an energy value exceeded a certain value, the silicon returned to an amorphous state and grain size rapidly decreased, thus forming microcrystal. Referring to FIG. 17, which shows a relationship between ELA energy and grain size, the grain size increased as energy increased. The grain size attained its maximum when energy exceeded Ed at which a sufficiently large grain size GM could be obtained. Further increases in energy decreased, and soon rapidly decreased, the grain size. While it was not proven that the energy level which maximizes the grain size strictly agrees with such threshold value energy, the energy level which maximized the grain size in the experiments was very close to the threshold value energy and the threshold value energy was larger than the energy level which maximizes the grain size. Therefore, hereinafter, the energy level which maximize the grain size and the threshold value energy over which the grain size rapidly decreases are regarded to as identical for practical purposes. In other words, it is defined that such threshold value energy is a border; the maximum grain size can be obtained just under the border and microcrystal is obtained over the border. Such threshold value energy is referred to as the upper limit Eu of the allowed area.

Figure 1:
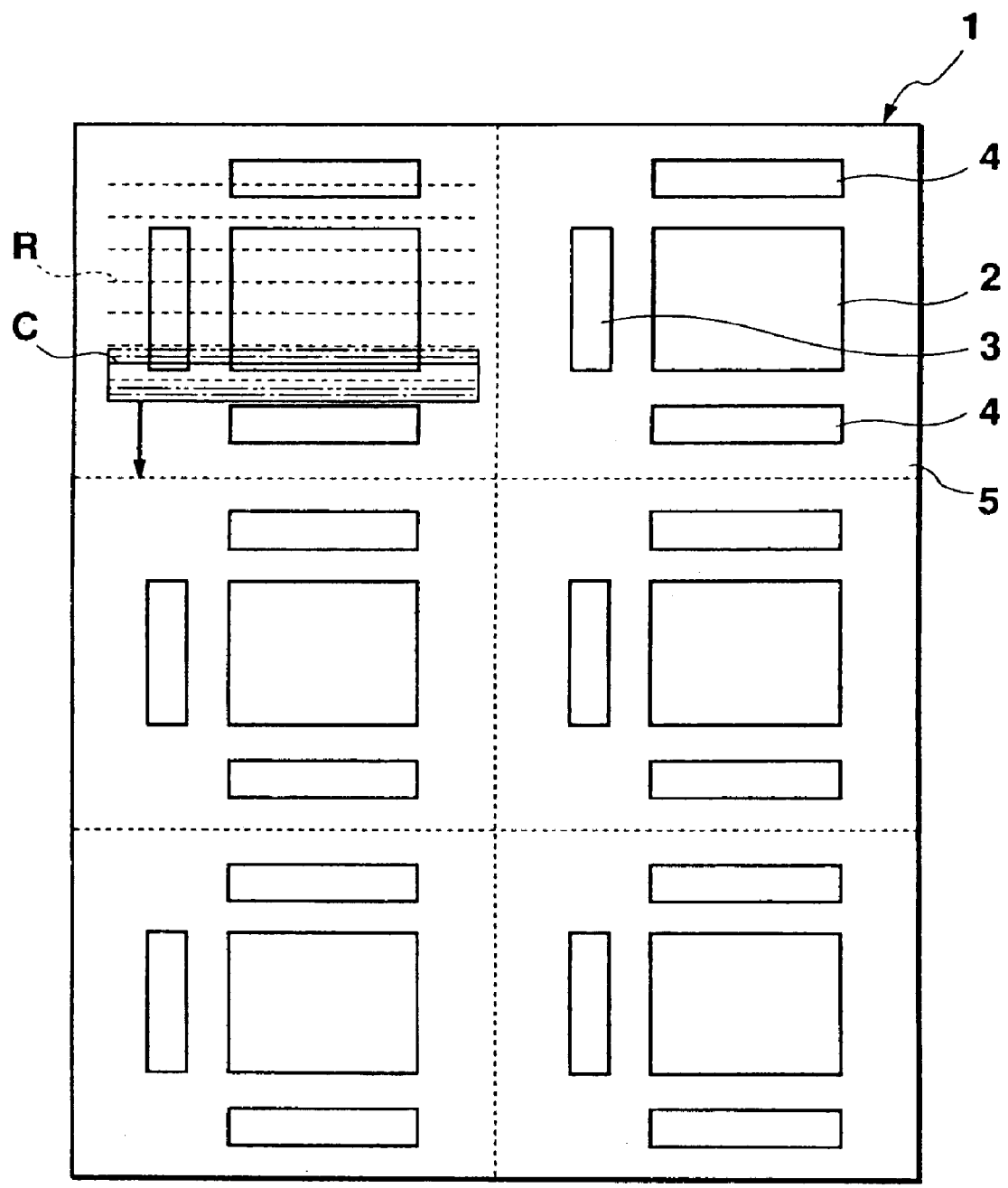
FIG. 1 is a view explaining a conventional positional relationship between a substrate to be processed and a region to be irradiated by a line beam.
Figure 2:
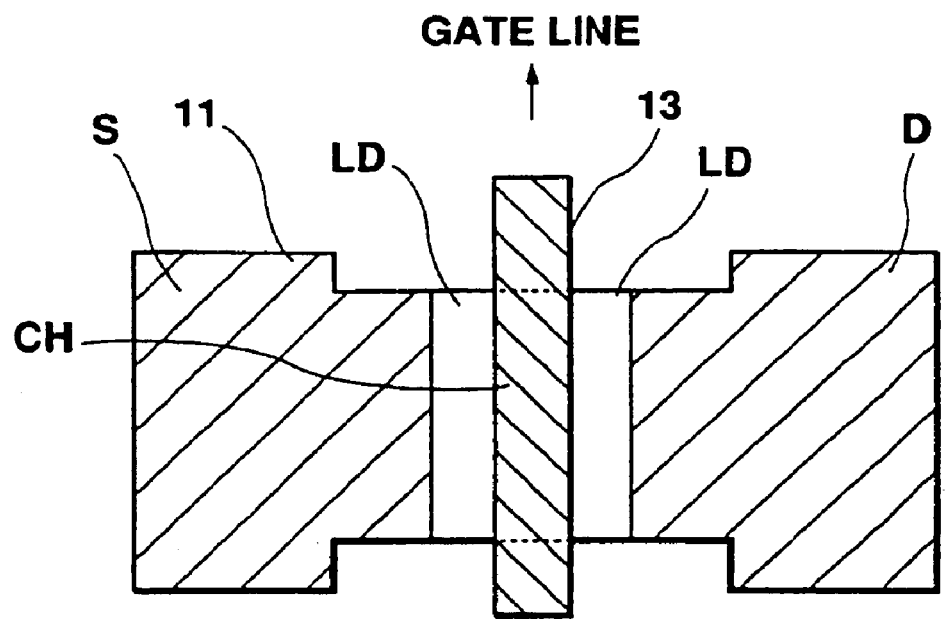
FIG. 2 is a view showing a planar construction of a TFT formed by a conventional laser anneal.
Figure 3:
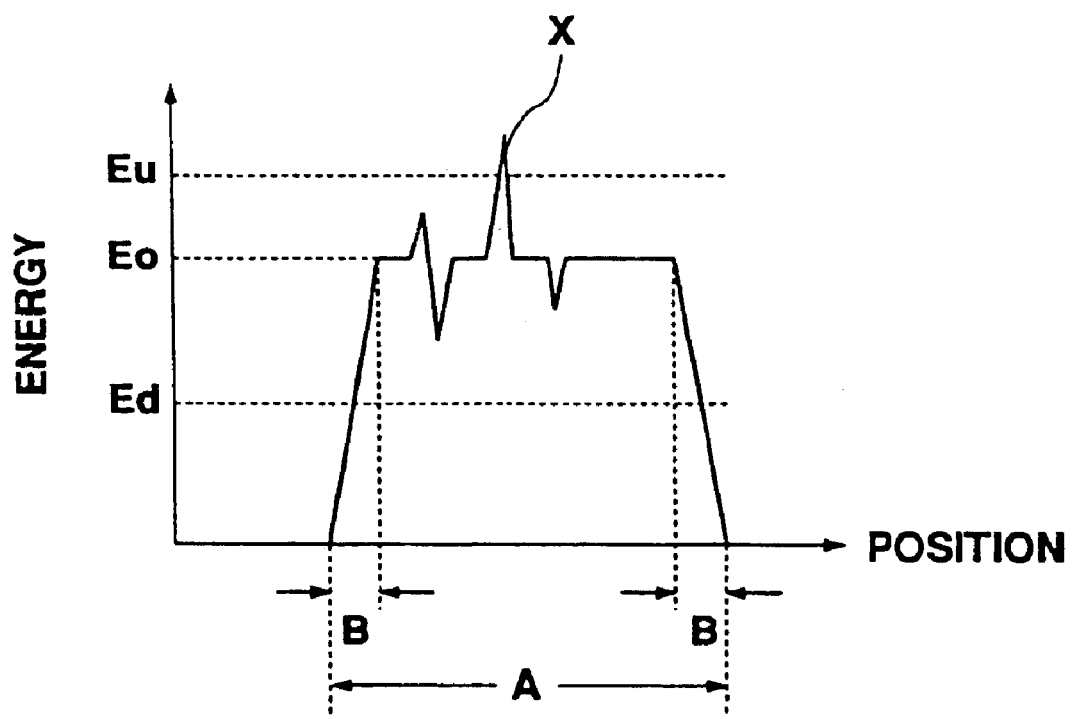
FIG. 3 is a graph explaining an energy profile of an irradiation laser beam.

It is understood from FIG. 17 that an energy level should be in a range from Ed to Eu to obtain a grain size over GM. Particularly, it is understood from the shape of the characteristic curve in the figure that the laser energy should be as high as possible within a range under the threshold value energy over which silicon is changed into an amorphous state to obtain maximum grain size. However, as shown in FIG. 3, unevenness of irradiated laser energy cannot be avoided. Therefore, when an irradiated energy exceeds, even slightly, the threshold value energy over which the grain size rapidly decreases the corresponding region becomes a defective crystallization region, thereby degrading characteristics of a TFT formed in this region.

Accordingly, excellent ELA can be performed by an energy profile such that, as shown in FIGS. 5 to 8, the energy level gently decreases from the front side along the scan direction of an irradiated laser beam to the backside to intersect the level of the threshold value energy Eth over which grain size rapidly decreases. The energy level of the beam profile exceeds the threshold value energy Eth at the front area along the scan direction of the beam. The level lowers as nearer the rear area with respect to the scan direction, allowing an annealing with the maximum energy which does not exceed the threshold value energy Eth within the region GR just below the intersection of the energy Eth and the profile to be performed, thereby forming a p-Si layer having the maximum grain size. In other words, there is an energy region GR, which maximizes grain size, at just below the threshold value energy Eth over which a grain size rapidly decreases. Microcrystal is formed in a region having an energy level over the threshold value energy Eth at the front area of the region GR. Passing through the region GR next forms a p-Si layer of maximum grain size. In the region at the rear of the region GR, the grains, once formed, are never microcrystallized, since the energy level in this region does not exceed the threshold value energy Eth. Accordingly, it is possible to form a p-Si layer of maximum grain size because of excellent annealing over the entire region of a film to be processed by setting an overlap amount and a pulse frequency such that an area in the film to be processed is shot at predetermined times within the region GR.

The structure of the above laser irradiation apparatus for performing laser annealing will next be explained with reference to FIG. 18.

In this figure, reference 51 denotes a laser oscillation source. References 52 and 61 denote mirrors. References 53, 54, 55, and 56 denote cylindrical lenses. References 57, 58, 59, 62, and 63 denote convergence lenses. A reference 60 denotes a slit determining the line width direction, and a reference 65 denotes a slit determining the line length direction. A reference 64 denotes a stage for supporting a substrate 7 to be processed which has a surface where an a-Si layer is formed. The slit 65 is provided close to the stage 64.

Laser light is supplied by an excimer laser in a pulse wave form. Laser light irradiated from the laser oscillation source 51 is shaped by two pairs of condenser lenses consisting of a pair of cylindrical lenses 53 and 55 and a pair of cylindrical lenses 54 and 56, into parallel light whose intensity has an almost flat output distribution in the longitudinal and lateral directions. This parallel light is referring to FIG. 19, converged in one direction by lenses 58, 59, 62, and 63, and is referring to FIG. 20, expanded in another direction by a lens 57, to create a band-like, rectangular, or linear for practical purposes, beam that is irradiated on the substrate 7 to be processed. A slit 60 for adjusting the line width and a slit 65 for adjusting the line length respectively shield both end portions in the line width direction [A], and in the line length direction, to clearly define the shape to be irradiated, thus generating a line beam of a width A while constantly maintaining the intensity in the effective irradiation region.

The stage 64 where the substrate 7 is mounted is arranged to be movable in the X- and Y-directions. With use of this kind of apparatus, the annealing processing as described above can be carried out with a high throughput for a substrate of a large area, even when annealing processing is carried out in a plurality of steps.

Figure 19:
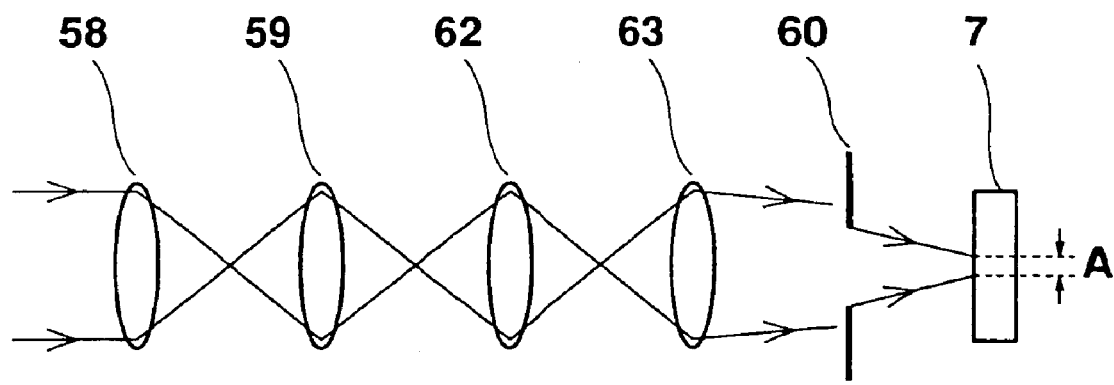
FIGS. 19 and 20 are views explaining the structure of an optical system of a laser irradiation apparatus shown in FIG. 18.
Figure 20:
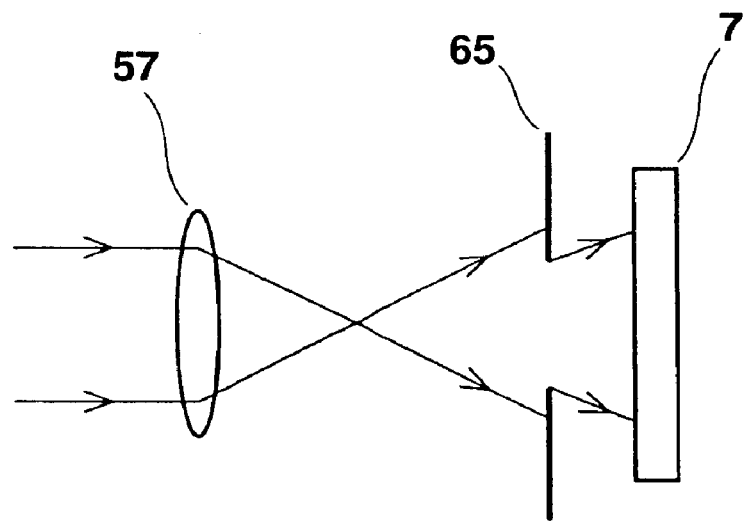

In addition, the laser irradiation apparatus as described above is capable of arbitrarily setting a distance between the focal point of the laser beam and the substrate 7 to be processed by the optical system shown in FIGS. 18 to 20 and adjusting an energy profile of the laser beam irradiated on the substrate 7 by setting the distance at a predetermined value as described below.

EXAMPLES

Figure 21:
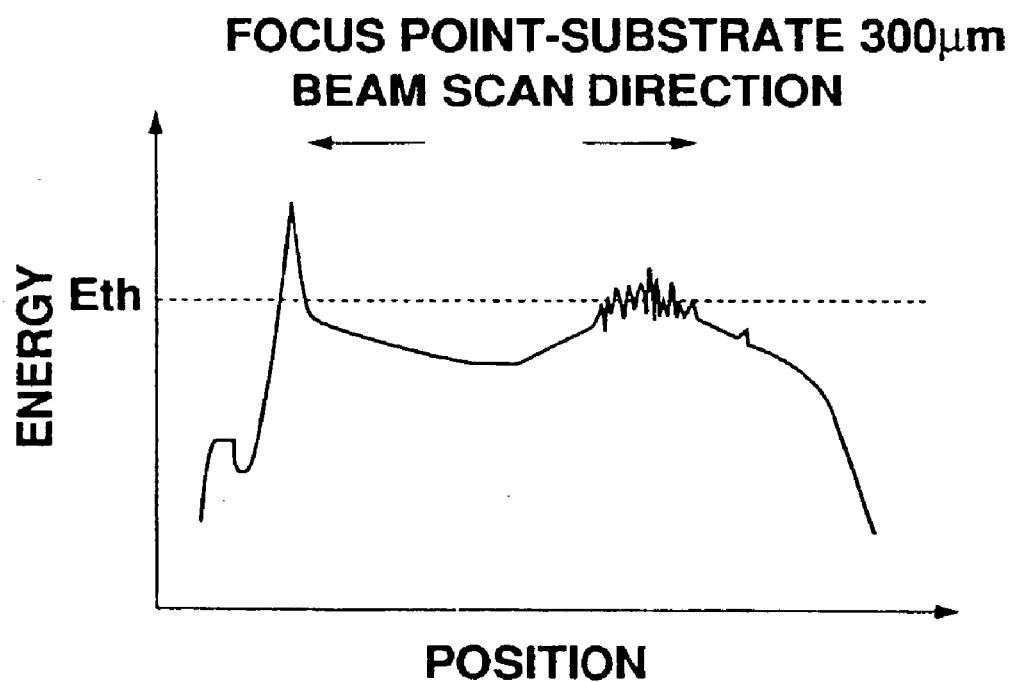
FIG. 21 is a graph showing a beam profile of a laser beam used in an ELA according to Example 1 of the present invention.
Figure 18:
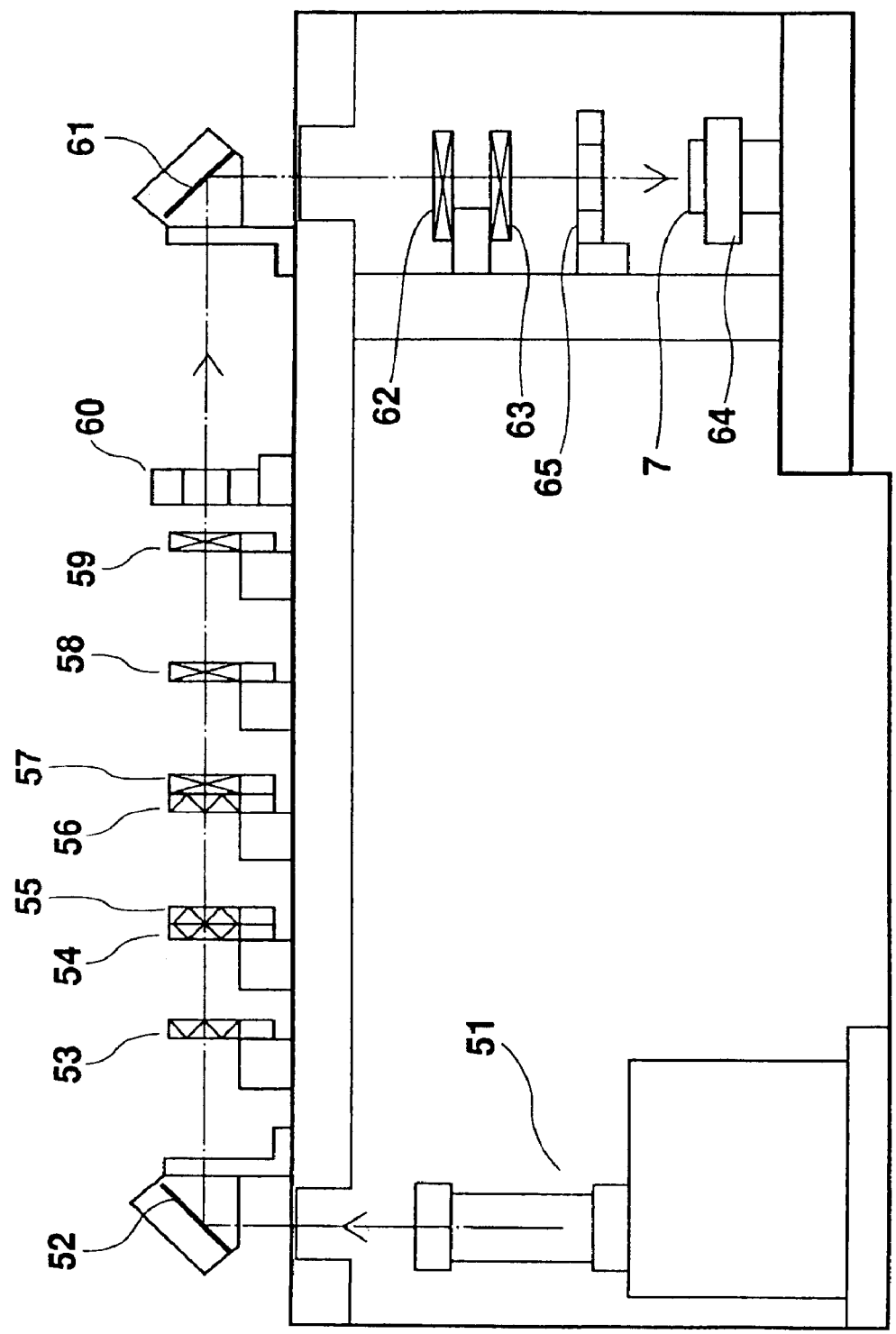
FIG. 18 is a schematic view of the structure of a laser irradiation apparatus used in an embodiment of the present invention.
Figure 23A:
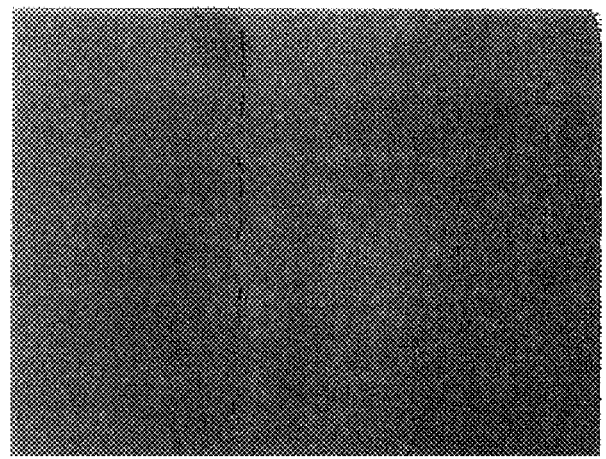
FIGS. 23A, 23B and 23C are views showing microphotographs of a p-Si layer, when the scan direction of a laser beam shown in FIG. 21 is set in the right direction in FIG. 21.
Figure 23B:
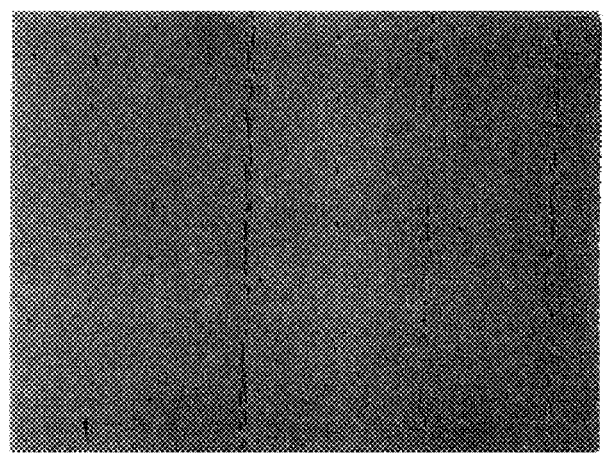
Figure 23C:
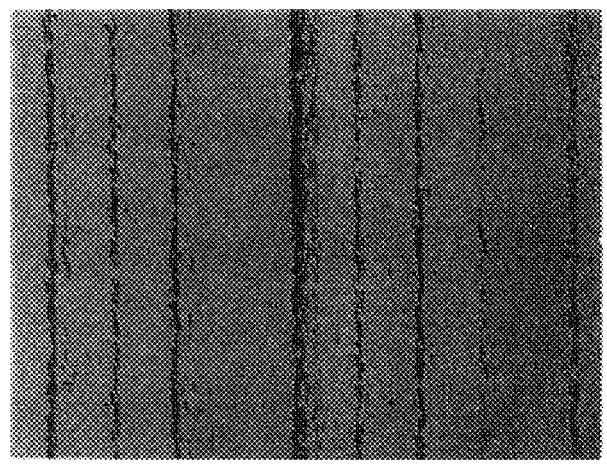

FIG. 21 is a graph of a first practical example, showing a beam profile with regard to the ELA apparatus shown in FIG. 18 in a case in which a distance between a focal point of a laser beam and a substrate to be processed was set at 300 μm. In this graph, the energy level had a shape that spikes to the left side of the profile. FIGS. 22A, 22B, and 22C are optical microphotographs showing when scanning was performed in such a manner that a scan direction of a line beam with the energy profile shown in FIG. 21 was set in the left direction in FIG. 21. It is possible to examine a state of the film by observing interfered light, caused by a difference of a grain size, which had different color depending on grain size because of Secco etching performed. FIGS. 22A, 22B, and 22C correspond to energy densities of 390 mJ/cm$^2$, 400 mJ/cm$^2$, and 410 mJ/cm$^2$ respectively. FIGS. 23A, 23B, and 23C are optical microphotographs taken when scanning is performed in such a manner that a scan direction of a line beam with the energy profile shown in FIG. 21 is set in the right direction. In FIGS. 22A, 22B, and 22C, there are very few black points in which defective crystallization regions exist and those that are present are not localized, showing a p-Si layer having excellent quality is formed on the other hand, in FIGS. 23A, 23B, and 23C, vertically linear defective crystallization regions shown in black are recognized.

Further, as shown in FIG. 23C, linear black regions are quite prominent, showing the existence of a large area of defective crystallization, and that the film is of a remarkably low quality.

The following can be inferred from the above observations. In the line beam having the energy profile shown in FIG. 21, the jumping part is subject to exceed the microcrystallizing temperature or the threshold value energy Eth over which a grain size rapidly decreases. Especially, the more enhanced the laser energy is, the higher the probability that such event will occur. When the line beam was scanned in the right direction of FIG. 21, the film to be processed was annealed while the very end of irradiated region along the scan direction is microcrystallized. Accordingly, p-Si formed at the front area with respect to the scan direction was changed into microcrystal at the rear of the beam and remains as defective crystallization regions as shown in FIGS. 23A, 23B, and 23C. Such events are apt to occur with higher energies. Therefore, in attempts to obtain a large grain size, a problem occurs that microcrystal is formed.

On the contrary, when the line beam was scanned in the left direction of FIG. 21, microcrystal tended to form toward the front area of the beam. Thereafter, however, excellent crystallization was performed within the energy region just below the threshold value energy as the beam passes, thereby forming p-Si having a large grain size. In FIG. 22C, few defective crystallization regions in black are recognized, showing that the upper limit of the energy range to be set is less than 410 mJ/cm$^2$.

Therefore, it is understood with the beam line having the energy profile as shown in FIG. 21 that an ideal annealing for crystallizing is performed in conditions that the energy of the beam is set at about 400 to 410 mJ/cm$^2$ and a scan direction is in the left direction of the figure. In these conditions, microcrystal is formed at the front area of the beam. However, there is an area between the center area and the rear area of the beam that the energy level shifts from an energy region higher than the threshold value energy Eth over which a grain size rapidly decreases to an energy region lower than the threshold value energy Eth, thereby existing an optimal beam region GR in which an ideal annealing is performed. In this example, the laser beam is scanned such that a total of twenty pulses are performed. Thus, the number of pulses within the optimal beam region GR is less than twenty. However, as shown in FIGS. 9, 10, and 15, the initial several pulses complete formation of grains. Accordingly, it is possible to perform an excellent annealing by setting an overlap amount and a pulse frequency to optimal values such that an area in the film to be processed receives beam pulses at predetermined times.

Figure 24:
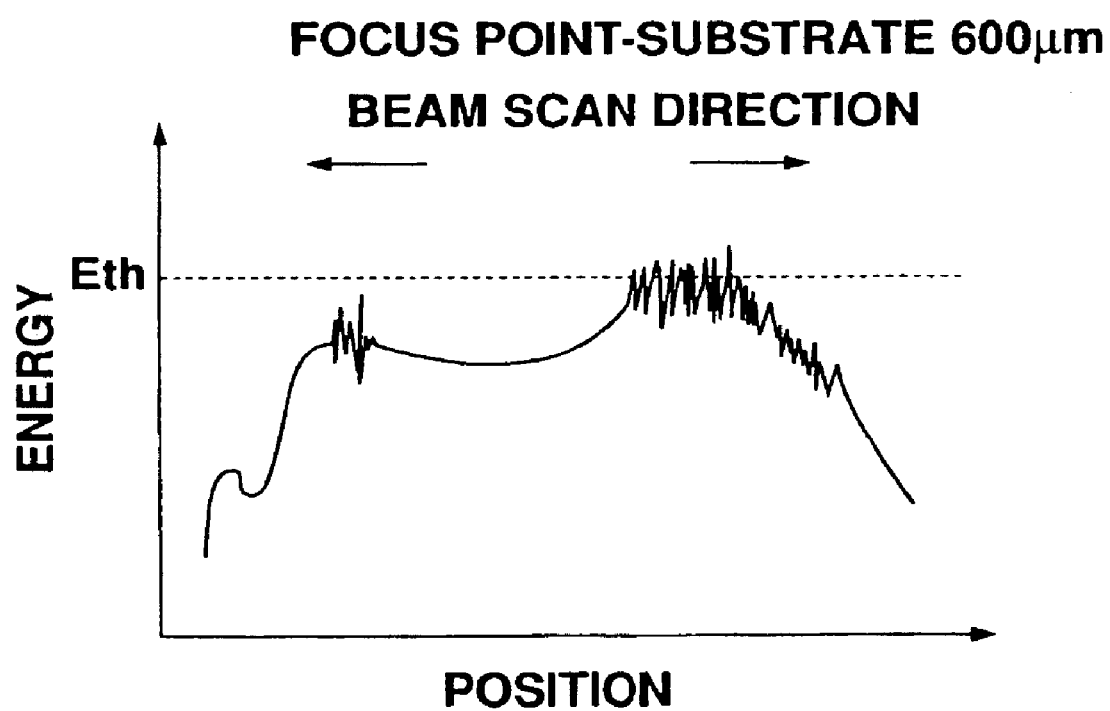
FIG. 24 is a graph showing a beam profile of a laser beam used in an ELA according to Example 2 of the present invention.
Figure 25A:
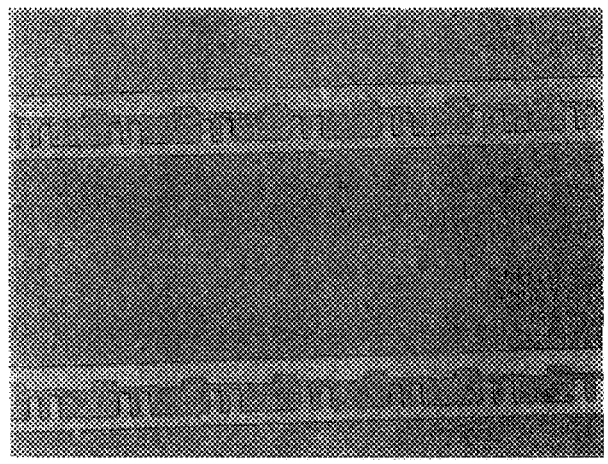
FIGS. 25A, 25B and 25C are views showing microphotographs of a p-Si layer when the scan direction of a laser beam shown in FIG. 24 is set in the left direction in FIG. 24.
Figure 25B:
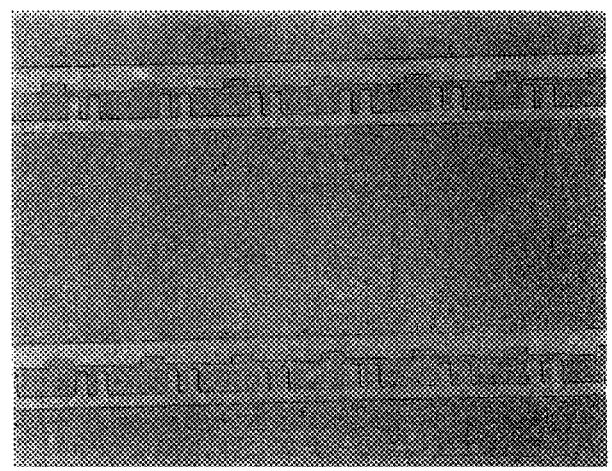
Figure 25C:
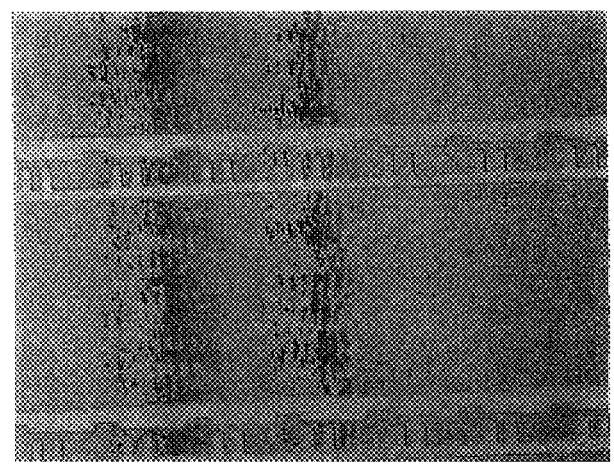
Figure 26A:
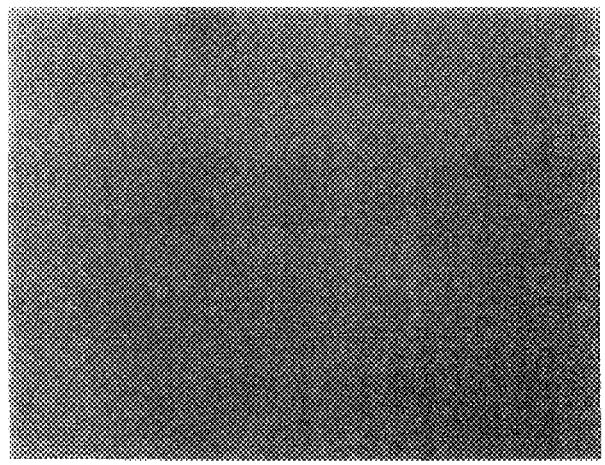
FIGS. 26A, 26B and 26C are views showing microphotographs of a p-Si layer when the scan direction of a laser beam shown in FIG. 24 is set in the right direction in FIG. 24.
Figure 26B:
Figure 26C:
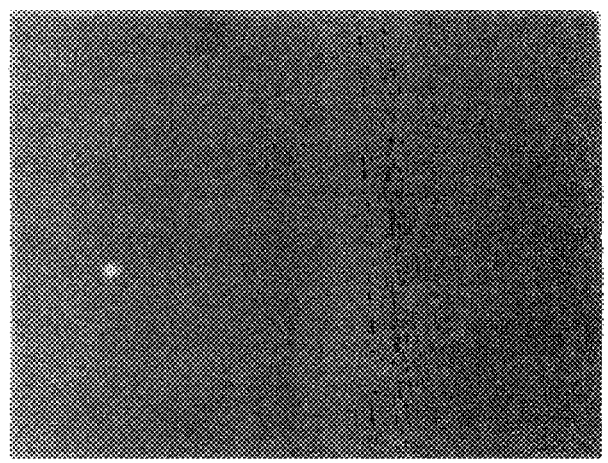

FIG. 24 is a graph, as a second example, showing a beam profile with regard to the ELA apparatus shown in FIG. 18 in a case where the distance between a focal point of a laser beam and a substrate to be processed was set at 600 μm. Change of the focal distance in this manner allows deformation of the beam profile utilizing an infinitesimal gap in light caused by diffraction and interference. FIGS. 25A, 25B, and 25C are optical microphotographs taken when scanning was performed in such a manner that a scan direction of a line beam with the energy profile shown in FIG. 24 was set in the left direction. FIGS. 26A, 26B, and 26C are optical microphotographs from th right direction. FIGS. 25A, 25B, and 25C, and, FIGS. 26A, 26B, and 26C correspond to energy densities of 390 mJ/cm$^2$, 400 mJ/cm$^2$, and 410 mJ/cm$^2$, respectively. The crystalline states shown in FIGS. 25A, 25B, 26A, and 26B, are excellent, while, those in FIGS. 25C and 26C, show a greater amount of defective crystallization regions. Especially, in FIG. 26C, defective crystallization regions formed are outstanding. It is inferred from this fact that the upper limit of the energy range to be set is about 410 mJ/cm$^2$. In the laser beam profile of this example, as shown in FIG. 24, the profile has a shape that it is relatively high in the right side of the profile. Accordingly, when scanning was performed in the left direction, microcrystal was formed toward the rear scanning region of the laser beam, which shortened the period of annealling within the optimal beam region GR in which an excellent annealing is performed to just below the threshold value energy Eth, past which grain size rapidly decreases. In other words, an annealing period under such optimal condition is shortened. Therefore, crystallization of microcrystal was not sufficient, which in turn led to the formation of defective crystallization regions as shown in FIG. 25C.

On the other hand, when the line beam was scanned in the right direction, in the initial stage of the laser energy irradiation, an annealing with an energy level over the threshold value energy Eth was performed. Thereafter, as in FIG. 7, since the period to be annealed within the optimal beam region GR in which an excellent annealing is performed just below the threshold value energy Eth is sufficiently long, a p-Si layer with an excellent crystallinity, as shown in FIGS. 26A to 26C, was obtained.

Figure 27:
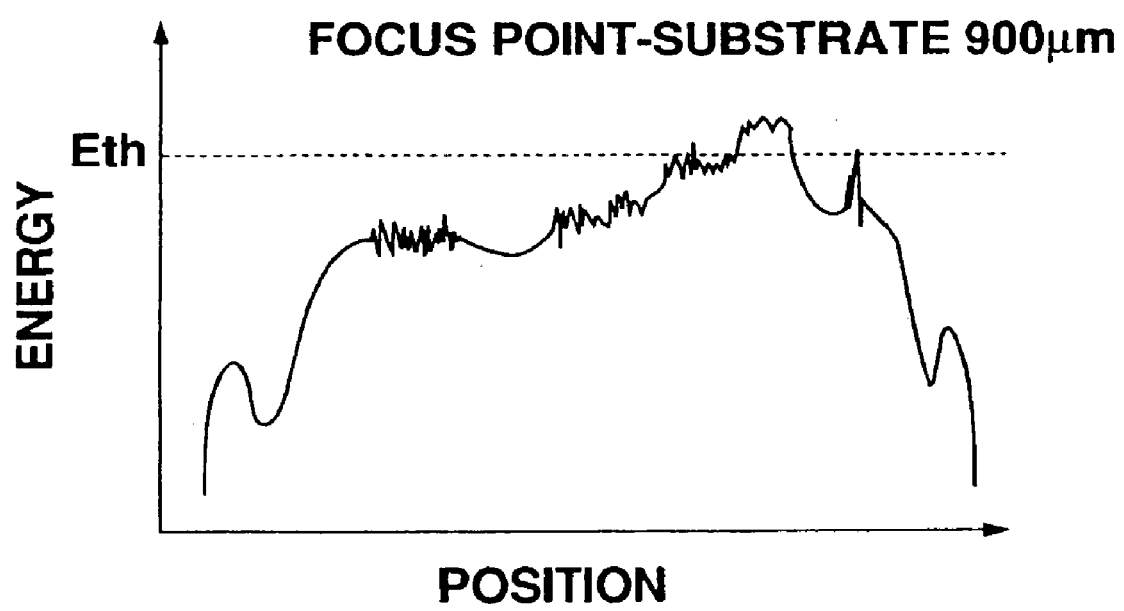
FIG. 27 is a graph showing a beam profile of a laser beam used in an ELA according to Example 3 of the present invention.

A third example follows. In this example, a distance between a focal point of a laser beam and a substrate to be processed was set at 900 μm. FIG. 27 is a graph showing a beam profile in this case. FIGS. 28A, 28B, 28C, 29A, 29B, and 29C are optical microphotographs taken when scanning was performed in such a manner that a scan direction of a line beam with the energy profile shown in FIG. 27 was set in the left and the right directions, respectively. FIGS. 28A, 28B, and 28C, and FIGS. 29A, 29B, and 29C correspond to energy densities of 390 mJ/cm$^2$, 400 mJ/cm$^2$, and 410 mJ/cm$^2$ respectively, as was the case for the previous examples. In all of these FIGS. 28A to 29C, the crystalline state is excellent. In the laser beam profile shown in FIG. 27, the profile has a shape, similar to FIG. 8, where a portion of the graph peaks in energy to the right of the center area of the profile, and the energy level gently decreases at both sides of the peak. Accordingly, regardless of the scan direction, which may be either the left direction or the right direction, the optimal beam region GR, in which a sufficiently large grain size can be obtained, exists at an energy level shifting from a region higher than the threshold value energy Eth to a region lower than the threshold value energy Eth, thereby enabling excellent annealing to be performed.

Finally, a construction example in which a transistor device, specifically a thin film transistor, was formed utilizing a polycrystal silicon film obtained by the above-described laser annealing method will be explained.

Figure 30:
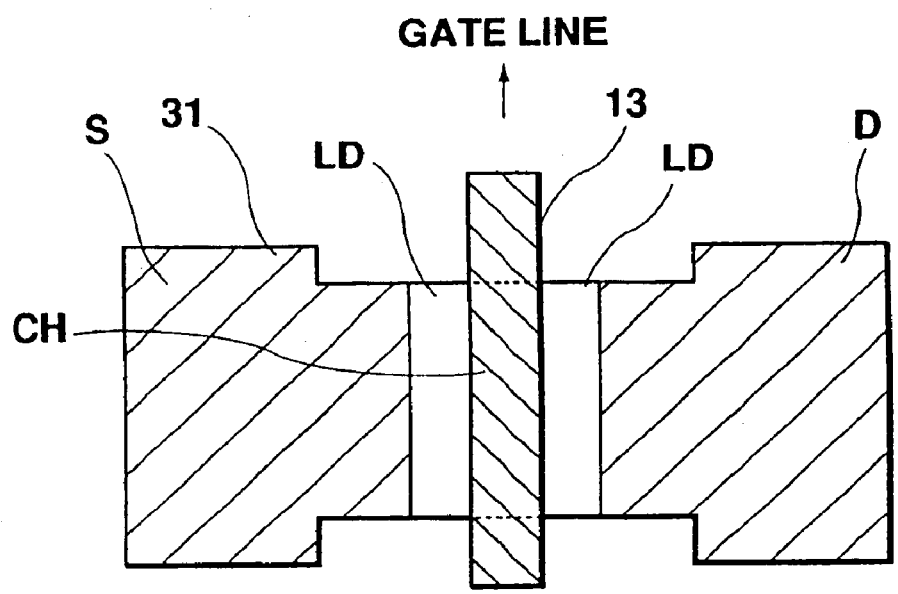
FIG. 30 is a view showing a planar construction of a TFT formed by a laser anneal according to an embodiment of the present invention.

FIG. 30 is a plane view of a TFT formed on the substrate 7 to be processed shown in FIG. 4 according to the present invention. A p-Si layer formed by the ELA method according to the present invention was etched into an island-like shape for use in a TFT. In the p-Si 11 thus formed, a non-doped channel region Ch, light-doped regions LD, and heavy-doped source and drain regions S and D were formed. On the channel region CH, a gate electrode 13 was formed with a gate insulating film inserted between the channel region and the gate electrode 13.

Figure 31:
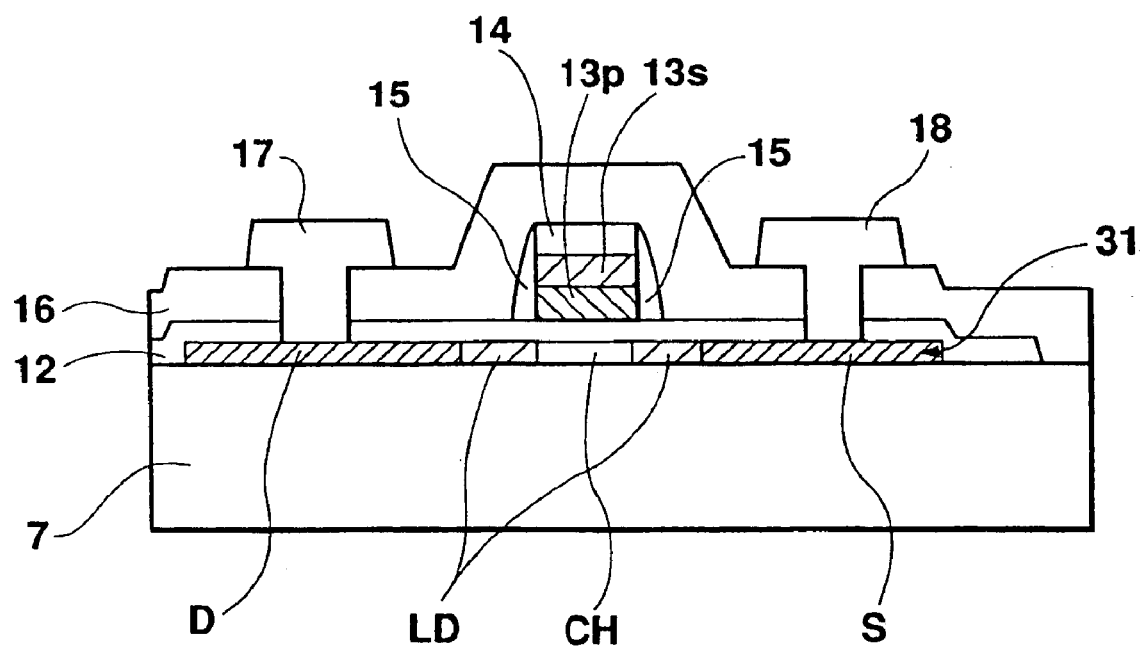
FIG. 31 is a view schematically showing a cross-section of the structure of the TFT shown in FIG. 30.

FIG. 31 shows an example of a cross-section where a TFT is completed. A p-Si layer 31 is formed in an island-like shape on a non-alkaline glass substrate 7 as a substrate to be processed, a non-doped channel region CH is formed in the p-Si layer 31, and regions LD are formed in both sides of a non-doped channel region CH. Source and drain regions S and D are formed outside the regions LD. A gate insulating film 12 covers the p-Si layer 31, and a gate electrode 13 consisting of a doped p-Si layer 13p, tungsten silicide 13s, or the like is formed at a region corresponding to the channel region CH. An implantation stopper 14 for preventing counter-doping when implantation ions of a different conductive type in the CMOS structure is formed on the gate electrode 13. Side walls 15 of the gate electrode 13 are formed to previously prepare margins so that the regions LD might not be enhanced over the edges of the gate electrode 13 when impurities implanted into the p-Si layer 31 are diffused in the lateral direction by activation annealing. A first inter-layer insulating film 16 is formed so as to cover the entire surface of the substrate 7, and drain and source electrodes 17 and 18 made of low-resistance metal are formed on the first inter-layer insulating film 16 and are respectively connected with drain and source regions D and S through contact holes CT formed in the gate insulating film 12 and the inter-layer insulating film 16.

If a TFT as shown in FIGS. 30 and 31 is used and constructed in a CMOS structure which is used as a driver circuit section (including a gate driver 23 and a drain driver 24) for an LCD as shown in FIG. 4, it is possible to simultaneously form a driver circuit with high performance and high speed in manufacturing steps substantially equal to those for a TFT for driving liquid crystal.

Figure 32:
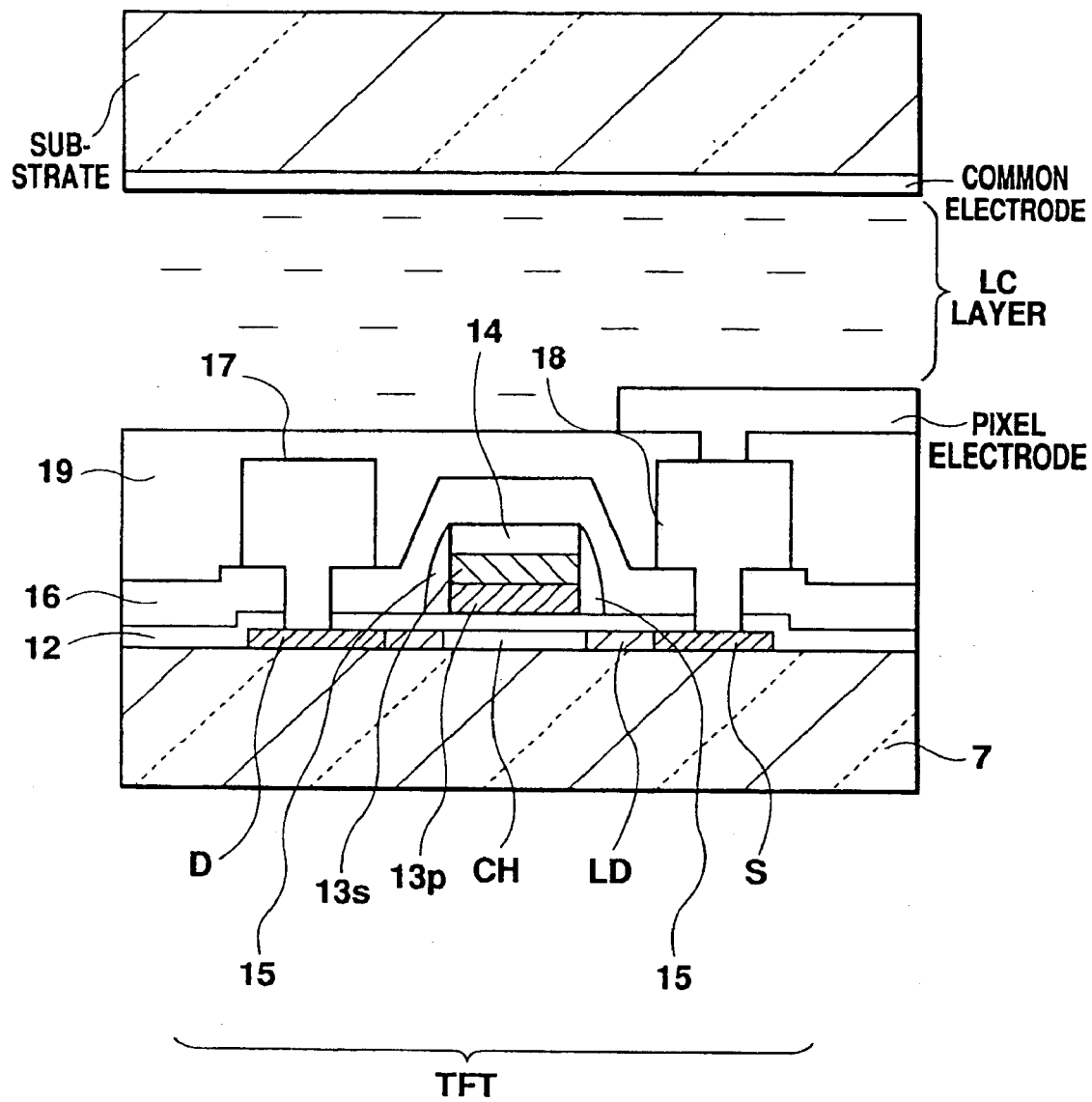
FIG. 32 is a view schematically showing a cross-section of the structure of a display area in a liquid crystal display apparatus using a TFT according to an embodiment of the present invention.

Further, in the display area 22 of the LCD shown in FIG. 4, a second inter-layer insulating film 19 having a flattening effect is formed on the entire surface so as to cover the drain electrode 17 and the source electrode 18 formed as shown in FIG. 32. In addition, a pixel electrode for driving liquid crystal is formed on the second inter-layer insulating film 19 and is connected with the source electrode 18.

For forming a liquid crystal display, another substrate is provided so as to face the substrate 7 on which TFTs and pixel electrodes connected thereto are formed. A liquid crystal layer is formed between the substrate. A common electrode coupled with a pixel electrode to constitute a liquid crystal drive capacitor is formed on the substrate facing the substrate 7.

As has been described above, by forming a polycrystal silicon film having a large grain size by an suitable laser annealing and utilizing the polycrystal silicon in a thin film silicon used for various devices (for example, a liquid crystal display), it is possible to form a transistor with a excellent operating characteristics by a low temperature process.

While there have been described what are at present considered to be preferred embodiments of the invention, it will be understood that various modifications may be made thereto, and it is intended that the appended claims cover all such modifications as fall within the true spirit and scope of the invention.

What is claimed is:

1. A laser anneal device comprising:

a laser light source;

an optical system for forming a line-form sheet beam from laser light emitted from the laser light source; and a mechanism for changing a relative position between a semiconductor film and the line-form sheet beam such that the line-form sheet beam scans the semiconductor film in a line width direction while the line-form sheet beam overlaps a previous scan in a predetermined amount; wherein the optical system creates a sloped energy level profile in the line-form sheet beam in a line width direction of the line-form sheet beam; and the mechanism changes the relative position between a semiconductor film and the line-form sheet beam such that a direction from a position, in the line-form sheet beam in the line width direction, in which the energy level is lower towards a position in which the energy level is higher matches a scan progress direction of the line-form sheet beam with respect to the semiconductor film.

2. A laser anneal device according to claim 1, wherein an energy level at a front position in the scan progress direction of the line-form sheet beam is approximately equal to or greater than a maximum value of an energy level which maximizes a grain size of the semiconductor film.

3. A laser anneal device according to claim 1, wherein a peak energy level at a rear position of the line-form sheet beam in the scan progress direction is less than a maximum value of an energy level which maximizes a grain size of the semiconductor film.

4. A laser anneal device according to claim 1, wherein an energy level at a front position in the scan progress direction of the line-form sheet beam is approximately equal to or greater than a maximum value of an energy level which maximizes a grain size of the semiconductor film; and a peak energy level at a rear position of the line-form sheet beam in the scan progress direction is less than a maximum value of an energy level which maximizes a grain size of the semiconductor film.

5. A laser anneal device according to claim 1, wherein the semiconductor film to be irradiated with the laser is an amorphous silicon film; and an energy level which maximizes a grain size of the semiconductor film is an energy level which maximizes a grain size of the semiconductor film is an energy level which maximizes a grain size of a polycrystalline silicon film obtained by laser annealing the amorphous silicon film.

* * * * *